(12) United States Patent
Lee et al.

(10) Patent No.: US 12,557,280 B2
(45) Date of Patent: Feb. 17, 2026

(54) THREE-DIMENSIONAL SEMICONDUCTOR MEMORY DEVICE WITH INCREASED ELECTRON MOBILITY AND ELECTRONIC SYSTEM INCLUDING THE SAME

(71) Applicant: Samsung Electronics Co., Ltd., Suwon-si (KR)

(72) Inventors: Tae In Lee, Daejeon (KR); Byung Jin Cho, Daejeon (KR); Jung Hoon Lee, Hwaseong-si (KR); Jaeduk Lee, Seongnam-si (KR)

(73) Assignees: Samsung Electronics Co., Ltd., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 714 days.

(21) Appl. No.: 17/874,927

(22) Filed: Jul. 27, 2022

(65) Prior Publication Data
US 2023/0071420 A1   Mar. 9, 2023

(30) Foreign Application Priority Data
Sep. 8, 2021  (KR) .......................... 10-2021-0119630

(51) Int. Cl.
*H10B 43/27*   (2023.01)
*H10B 43/40*   (2023.01)

(52) U.S. Cl.
CPC ............. *H10B 43/27* (2023.02); *H10B 43/40* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 6,709,935 B1    3/2004  Yu
8,860,031 B2 *  10/2014 Mori ...................... H10B 43/27
                                                     257/65
(Continued)

FOREIGN PATENT DOCUMENTS

JP    2011-198806 A    10/2011
KR    20100133558 A    12/2010
(Continued)

*Primary Examiner* — William B Partridge
*Assistant Examiner* — Gustavo G Ramallo
(74) *Attorney, Agent, or Firm* — Harness, Dickey & Pierce, P.L.C.

(57) ABSTRACT

A three-dimensional semiconductor memory device may include a substrate, a stack structure including interlayer dielectric layers and gate electrodes alternately and repeatedly stacked on the substrate, and vertical channel structures provided in vertical channel holes penetrating the stack structure. Each of the vertical channel structures may include a data storage pattern covering an inner side surface of each of the vertical channel holes, a vertical semiconductor pattern covering the data storage pattern, and a gapfill insulating pattern filling an internal space enclosed by the vertical semiconductor pattern. The vertical semiconductor pattern may have a first surface which is in contact with the gapfill insulating pattern, and a second surface which is in contact with the data storage pattern. A germanium concentration in the vertical semiconductor pattern may decrease in a direction from the first surface toward the second surface.

20 Claims, 18 Drawing Sheets

(58) Field of Classification Search
CPC ........ H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/10;
H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50

See application file for complete search history.

(56) References Cited

U.S. PATENT DOCUMENTS

| | | | |
|---|---|---|---|
| 9,520,406 | B2 | 12/2016 | Makala et al. |
| 9,559,115 | B2 | 1/2017 | Sim et al. |
| 9,570,463 | B1 * | 2/2017 | Zhang .................... H10B 43/50 |
| 10,020,317 | B2 | 7/2018 | Zhang et al. |
| 11,758,728 | B2 * | 9/2023 | Yamanaka ............. H10B 43/35 |
| | | | 257/314 |
| 2014/0061770 | A1 * | 3/2014 | Lee ...................... H10D 30/689 |
| | | | 257/324 |
| 2014/0097484 | A1 * | 4/2014 | Seol ....................... H10B 43/35 |
| | | | 257/324 |
| 2015/0221665 | A1 * | 8/2015 | Yasuda .................. H10B 43/27 |
| | | | 257/324 |
| 2016/0099250 | A1 * | 4/2016 | Rabkin ................ H10D 64/035 |
| | | | 257/66 |
| 2016/0141294 | A1 * | 5/2016 | Peri ........................ H10B 43/35 |
| | | | 438/653 |
| 2016/0343569 | A1 | 11/2016 | Mazzamuto |
| 2017/0053986 | A1 * | 2/2017 | Liu ...................... H10D 64/035 |
| 2017/0263623 | A1 * | 9/2017 | Zhang ............... H01L 21/02636 |
| 2019/0027490 | A1 * | 1/2019 | Shin ........................ H10B 41/40 |
| 2019/0252396 | A1 * | 8/2019 | Mushiga ................ H10B 43/50 |
| 2020/0194445 | A1 | 6/2020 | Sharangpani et al. |
| 2020/0212060 | A1 | 7/2020 | Yoo et al. |
| 2021/0098490 | A1 | 4/2021 | Or-Bach et al. |

FOREIGN PATENT DOCUMENTS

| | | |
|---|---|---|
| KR | 2017-0026101 A | 3/2017 |
| KR | 20170127785 A | 11/2017 |
| KR | 20200018713 A | 2/2020 |
| KR | 10-2020-0081003 A | 7/2020 |
| KR | 10-2020-0083395 A | 7/2020 |
| KR | 102136849 B1 | 7/2020 |
| KR | 10-2188538 B1 | 12/2020 |
| KR | 10-2201923 B1 | 1/2021 |

* cited by examiner

THREE-DIMENSIONAL SEMICONDUCTOR MEMORY DEVICE WITH INCREASED ELECTRON MOBILITY AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0119630, filed on Sep. 8, 2021, in the Korean Intellectual Property Office, the entire contents of which are hereby incorporated by reference.

BACKGROUND

Some example embodiments relate to a three-dimensional semiconductor memory device, and in particular, a nonvolatile three-dimensional semiconductor memory device including a vertical channel structure, a method of fabricating the same, and/or an electronic system including the same.

A semiconductor device capable of storing a large amount of data is required or used as a data storage of an electronic system. Higher integration of semiconductor devices is required or desired to at least partially satisfy consumer demands for large data storing capacity, superior performance, and/or inexpensive prices. In the case of two-dimensional or planar semiconductor devices, since their integration is mainly determined by the area occupied by a unit memory cell, integration is greatly influenced by the level of a fine pattern forming technology. However, extremely expensive process equipment needed or used to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

Some example embodiments provide a three-dimensional semiconductor memory device with improved reliability and/or electrical characteristics, and/or a method of fabricating the same.

Alternatively or additionally, some example embodiments provide an electronic system including the three-dimensional semiconductor memory device.

According to some example embodiments, a three-dimensional semiconductor memory device may include a substrate, a stack structure including interlayer dielectric layers and gate electrodes which are alternately and repeatedly stacked on the substrate, and vertical channel structures in vertical channel holes that penetrate the stack structure. Each of the vertical channel structures may include a data storage pattern covering an inner side surface of each of the vertical channel holes, a vertical semiconductor pattern covering the data storage pattern, and a gapfill insulating pattern filling an internal space which is enclosed by the vertical semiconductor pattern. The vertical semiconductor pattern may have a first surface in contact with the gapfill insulating pattern, and a second surface in contact with the data storage pattern. A germanium concentration in the vertical semiconductor pattern may decrease in a direction from the first surface toward the second surface.

According to some example embodiments, a method of fabricating a three-dimensional semiconductor memory device may include forming a stack structure on a substrate, and forming vertical channel structures to penetrate the stack structure. The forming of the vertical channel structures may include forming vertical channel holes to penetrate the stack structure and to expose a top surface of the substrate, forming a data storage pattern which includes a plurality of insulating layers sequentially covering an inner side surface of each of the vertical channel holes, forming a first vertical channel layer on the data storage pattern, forming a second vertical channel layer on the first vertical channel layer, performing a thermal treatment process on the first and second vertical channel layers to form a third vertical channel layer, etching a portion of the third vertical channel layer to form a vertical semiconductor pattern, and forming a gapfill insulating pattern to fill an internal space of each of the vertical channel holes. The thermal treatment process may be performed such that a germanium concentration in the third vertical channel layer continuously decreases in a direction toward the data storage pattern.

According to some example embodiments, an electronic system may include a three-dimensional semiconductor memory device and a controller which is electrically connected to the three-dimensional semiconductor memory device and is configured to control the three-dimensional semiconductor memory device. The three-dimensional semiconductor memory device may include a first substrate, a peripheral circuit structure on the first substrate, a second substrate on the peripheral circuit structure, a stack structure including interlayer dielectric layers and gate electrodes which are alternately and repeatedly stacked on the second substrate, vertical channel structures in vertical channel holes penetrating the stack structure, contact plugs to penetrate a portion of the stack structure and connected to the gate electrodes, bit lines on the stack structure and connected to the vertical channel structures, conductive lines on the stack structure and connected to the contact plugs, and an input/output pad on the stack structure and connected to the peripheral circuit structure. The controller may be electrically connected to the three-dimensional semiconductor memory device through the input/output pad. Each of the vertical channel structures may include a data storage pattern covering an inner side surface of each of the vertical channel holes, a vertical semiconductor pattern covering the data storage pattern, and a gapfill insulating pattern filling an internal space, which is in each of the vertical channel holes and is enclosed by the vertical semiconductor pattern. The vertical semiconductor pattern may have a first surface in contact with the gapfill insulating pattern and a second surface in contact with the data storage pattern. A germanium concentration in the vertical semiconductor pattern may decrease in a direction from the first surface toward the second surface.

DETAILED DESCRIPTION

Various example embodiments will now be described more fully with reference to the accompanying drawings, in which example embodiments are shown.

Figure 1:
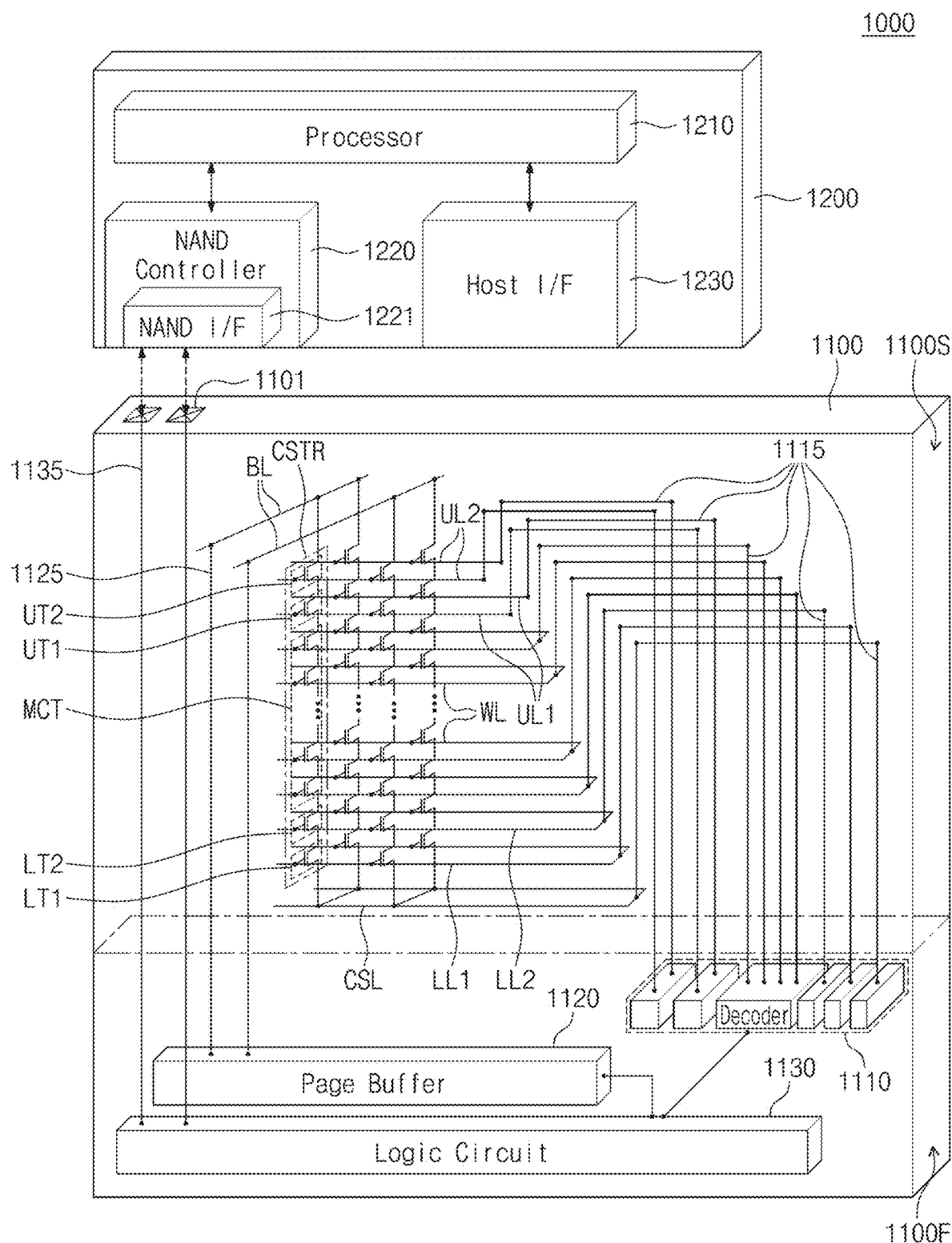
FIG. 1 is a schematic diagram illustrating an electronic system including a three-dimensional semiconductor memory device according some example embodiments.

FIG. 1 is a schematic diagram illustrating an electronic system including a three-dimensional semiconductor memory device according some example embodiments.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 and/or an electronic device which may include such a storage device. For example, the electronic system 1000 may be or include one or more of a solid state drive (SSD) device, a universal serial bus (USB), a computing system, a medical system, or a communication system, in which at least one three-dimensional semiconductor memory device 1100 is provided.

The three-dimensional semiconductor memory device 1100 may be or may include a nonvolatile memory device (e.g., a three-dimensional NAND FLASH memory device to be described below). The three-dimensional semiconductor memory device 1100 may include a first region 1100F and a second region 1100S on the first region 1100F. In some example embodiments, the first region 1100F may be disposed beside the second region 1100S. The first region 1100F may be or may include a peripheral circuit region, which includes a decoder circuit 1110, a page buffer 1120, and a logic circuit 1130. The second region 1100S may be or may include a memory cell region, which includes a bit line BL, a common source line CSL, word lines WL, first lines LL1 and LL2, second lines UL1 and UL2, and memory cell strings CSTR between the bit line BL and the common source line CSL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed and may be the same, or may be different from each other, according to various example embodiments.

In some example embodiments, the first transistors LT1 and LT2 may include a ground selection transistor, and the second transistors UT1 and UT2 may include a string selection transistor. The first lines LL1 and LL2 may be used as gate electrodes of the first transistors LT1 and LT2, respectively. The word lines WL may be used as gate electrodes of the memory cell transistors MCT. The second lines UL1 and UL2 may be used as gate electrodes of the second transistors UT1 and UT2, respectively.

In some example embodiments, the first transistors LT1 and LT2 may include a first erase control transistor LT1 and a ground selection transistor LT2, which are connected in series. The second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit line BL may be electrically connected to the page buffer 1120 through second interconnection lines 1125, which are extended from the first region 1100F to the second region 1100S.

In the first region 1100F, the decoder circuit 1110 and the page buffer 1120 may be configured to perform a control operation, which is performed on at least one memory cell transistor selected from the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is connected or electrically connected to the logic circuit 1130. The input/output pad 1101 may be electrically connected to the logic circuit 1130 through an input/output interconnection line 1135, which is extended from the first region 1100F to the second region 1100S.

The controller 1200 may include a processor 1210, a NAND controller 1220, and a host interface 1230. For example, the electronic system 1000 may include a plurality of three-dimensional semiconductor memory devices 1100, and in this case, the controller 1200 may control the plurality of three-dimensional semiconductor memory devices 1100.

The processor 1210 may control overall operations of the electronic system 1000 including the controller 1200. Based on a specific firmware, the processor 1210 may execute operations of controlling the NAND controller 1220 and accessing to the three-dimensional semiconductor memory device 1100. The NAND controller 1220 may include a NAND interface 1221, which is used for communication with the three-dimensional semiconductor memory device 1100. The NAND interface 1221 may be used to transmit and/or receive control commands, which are used to control the three-dimensional semiconductor memory device 1100. Alternatively or additionally, the NAND interface 1221 may be used to transmit and/or received data, which will be written in or read from the memory cell transistors MCT of the three-dimensional semiconductor memory device 1100, and so forth. The host interface 1230 may be configured to allow for communication between the electronic system 1000 and an external host. If a control command is provided from an external host through the host interface 1230, the processor 1210 may control the three-dimensional semiconductor memory device 1100.

Figure 2:
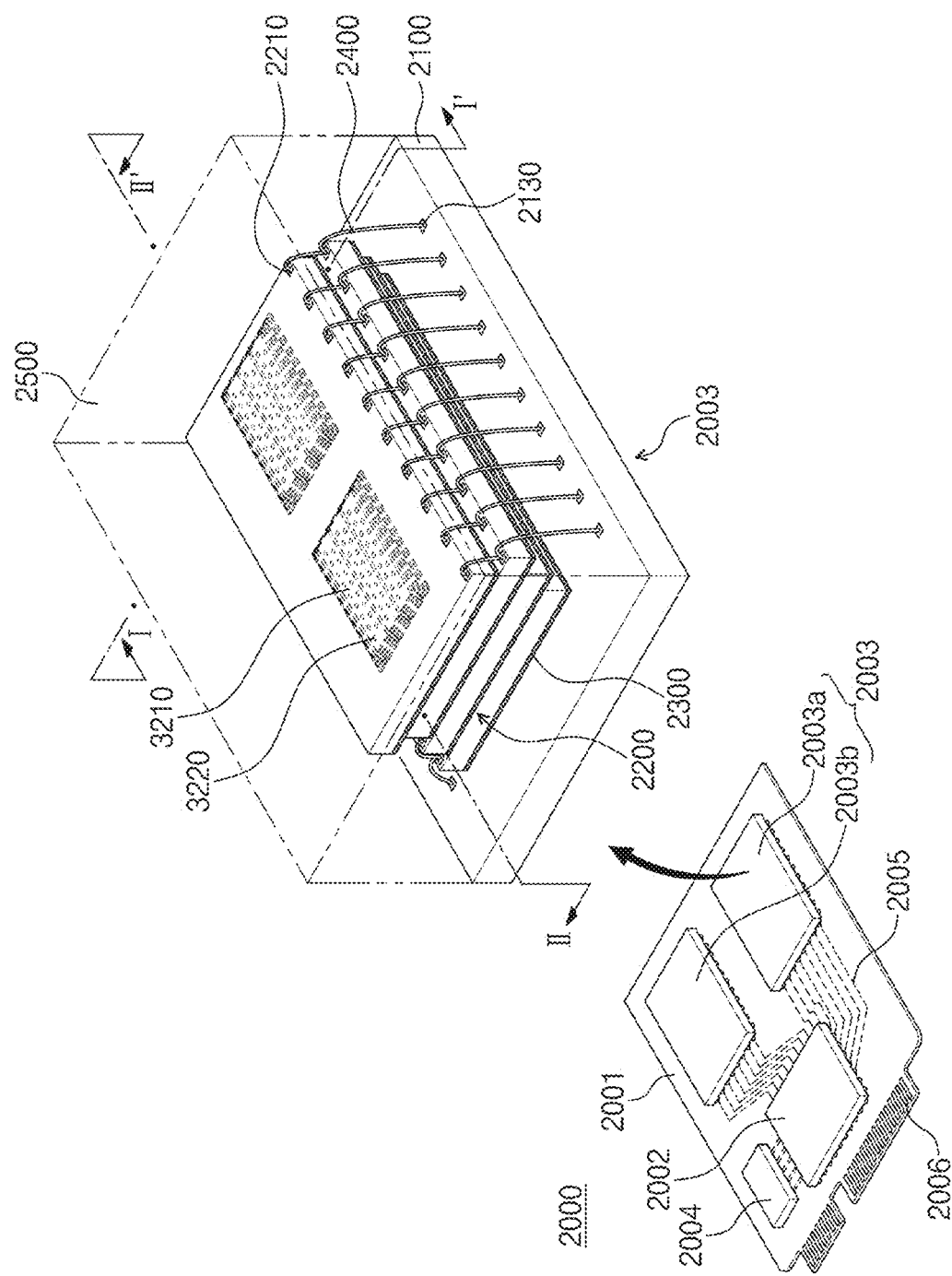
FIG. 2 is a perspective view schematically illustrating an electronic system including a three-dimensional semiconductor memory device according some example embodiments.

FIG. 2 is a perspective view schematically illustrating an electronic system including a three-dimensional semiconductor memory device according some example embodiments.

Referring to FIG. 2, an electronic system 2000 may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins coupled to or connected to an external host. In the connector 2006, the number and the arrangement of the pins may be changed depending on a communication interface between the electronic system 2000 and the external host. In some example embodiments, the electronic system 2000 may communicate with the external host, in accordance with one or more of various interfaces, such as universal serial bus (USB), peripheral component interconnect express (PCI-Express), serial advanced technology attachment (SATA), universal flash storage (UFS) M-PHY, or the like. In some example embodiments, the electronic system 2000 may be driven by an electric power, which is supplied from the external host through the connector 2006. The electronic system 2000 may further include a power management integrated circuit (PMIC) that is used to separately supply the electric power to the controller 2002 and the semiconductor package 2003. The electric power may be provided from the external host; however, example embodiments are not limited thereto.

The controller 2002 may be configured to control a writing and/or reading operation on the semiconductor package 2003. The controller 2002 may improve an operation speed of the electronic system 2000.

The DRAM 2004 may be or may include a buffer memory that is configured to relieve technical difficulties caused by a difference in speed between the semiconductor package 2003, which serves as a data storage device, and an external host. In some example embodiments, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are spaced apart from each other. Each of the first and second semiconductor packages 2003a and 2003b may be or may include a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be or may include a printed circuit board including package upper pads 2130. Each of the semiconductor chips 2200 may include input/output pads 2210. Each of the input/output pads 2210 may correspond to the input/output pad 1101 of FIG. 1. Each of, or at least some of, the semiconductor chips 2200 may include gate stack structures 3210 and vertical channel structures 3220. Each of, or at least some of, the semiconductor chips 2200 may include a three-dimensional semiconductor memory device, which will be described below.

In some example embodiments, the connection structure 2400 may be a bonding wire electrically connecting the input/output pads 2210 to the package upper pads 2130. In each of the first and second semiconductor packages 2003a and 2003b, the semiconductor chips 2200 may be electrically connected to each other in a bonding wire manner and may be electrically connected to the package upper pads 2130 of the package substrate 2100. In some example embodiments, the semiconductor chips 2200 in each of the first and second semiconductor packages 2003a and 2003b may be electrically connected to each other by through silicon vias (TSVs), not by or in addition to the connection structure 2400 provided in the form of bonding wires.

In some example embodiments, the controller 2002 and the semiconductor chips 2200 may be included in a single package. For example, the controller 2002 and the semiconductor chips 2200 may be mounted on an interposer substrate, which is prepared independent of the main substrate 2001, and may be connected to each other through interconnection lines, which are provided in the interposer substrate.

Figure 3:
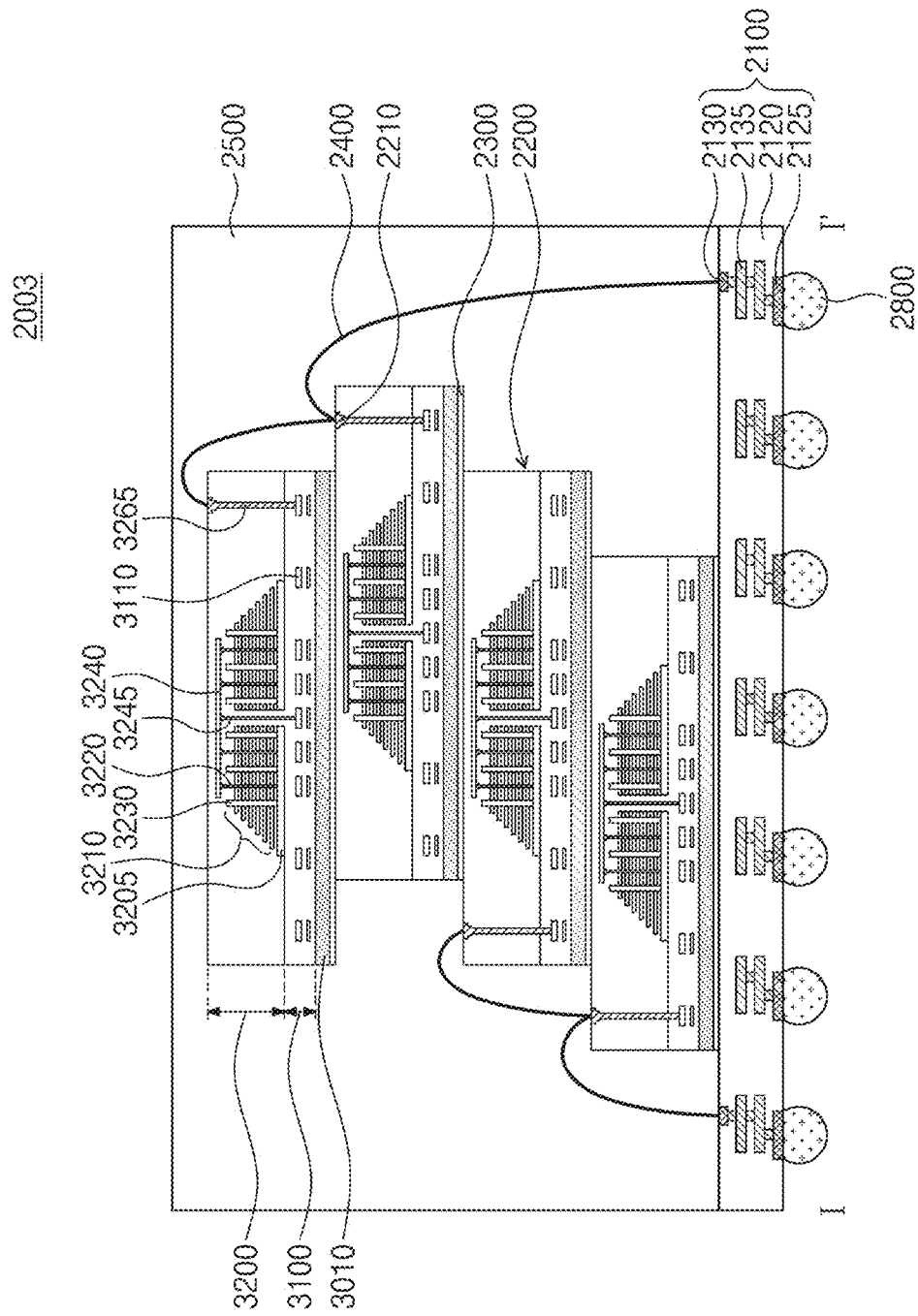
FIGS. 3 and 4 are sectional views, which are respectively taken along lines I-I' and II-II' of FIG. 2 to illustrate a semiconductor package including a three-dimensional semiconductor memory device according some example embodiments.
Figure 4:
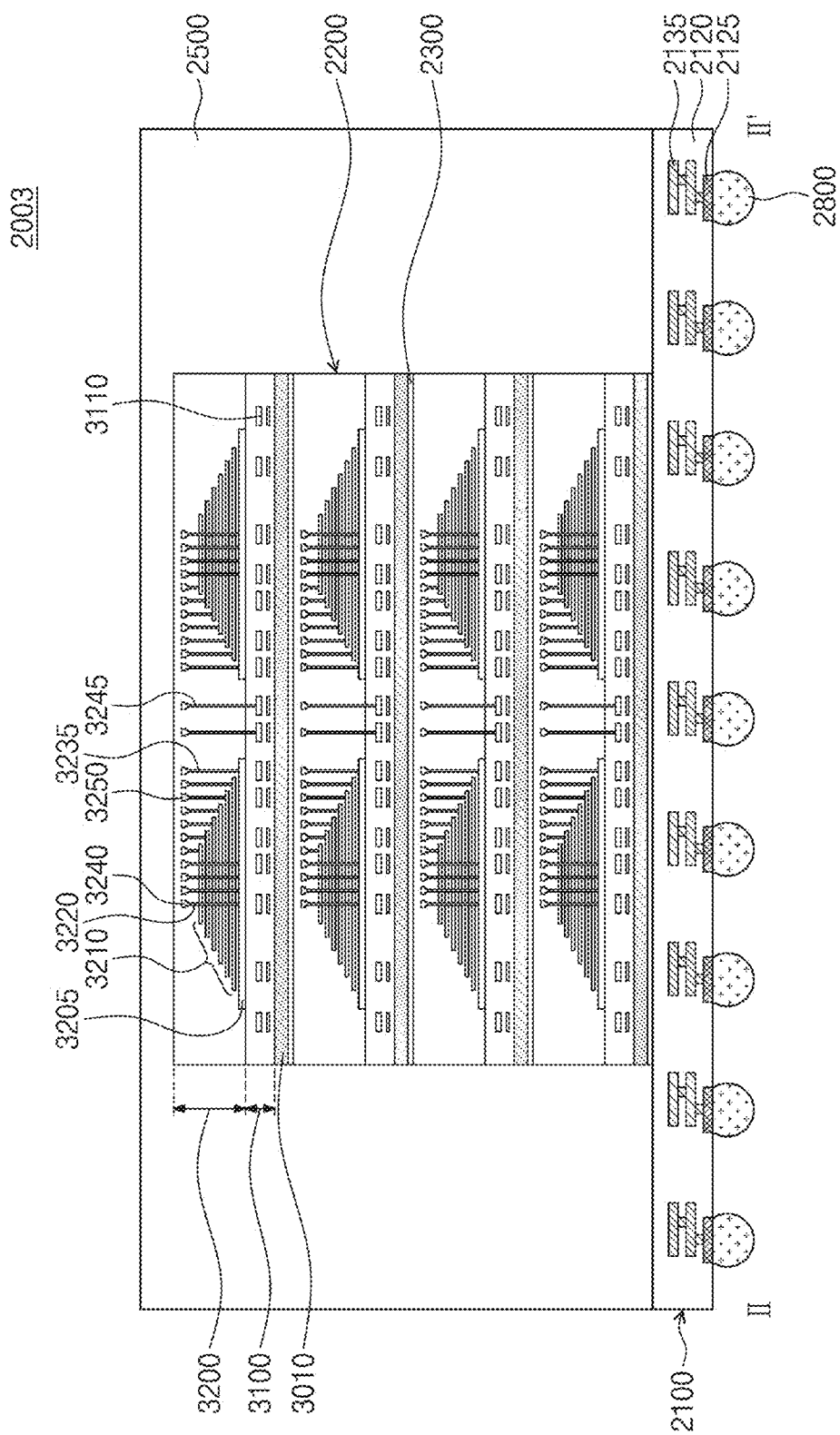

FIGS. 3 and 4 are sectional views, which are respectively taken along lines I-I' and II-II' of FIG. 2 to illustrate a semiconductor package including a three-dimensional semiconductor memory device according some example embodiments.

Referring to FIGS. 3 and 4, the semiconductor package 2003 may include the package substrate 2100, a plurality of semiconductor chips 2200 on the package substrate 2100, and the molding layer 2500 covering the package substrate 2100 and the semiconductor chips 2200.

The package substrate 2100 may include a package substrate body portion 2120, the package upper pads 2130 disposed on a top surface of the package substrate body portion 2120, lower pads 2125 disposed on and/or exposed through a bottom surface of the package substrate body portion 2120, and internal lines 2135 provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 of FIG. 2 through conductive connecting portions 2800.

Each of or at least some of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a common source line 3205, a gate stack structure 3210 on the common source line 3205, vertical channel structures 3220 and separation structures 3230 penetrating the gate stack structure 3210, bit lines 3240 electrically connected to the vertical channel structures 3220, gate interconnection lines 3235 electrically connected to word lines (e.g., WL of FIG. 1) of the gate stack structure 3210, and conductive lines 3250. Each of or at least some of the gate interconnection lines 3235 may be electrically connected to a corresponding one of the word lines WL. At least one of the gate interconnection lines 3235 may be electrically connected to the common source line 3205.

Each of or at least some of the semiconductor chips 2200 may include penetration lines 3245, which are electrically connected to the peripheral lines 3110 of the first structure 3100 and are extended into the second structure 3200. The penetration line 3245 may be provided to penetrate the gate stack structure 3210, and in some example embodiments, the penetration line 3245 may be further disposed outside the gate stack structure 3210. Each of or at least some of the semiconductor chips 2200 may further include an input/output interconnection line 3265, which is extended into the second structure 3200 and is electrically connected to the peripheral line 3110 of the first structure 3100, and the input/output pad 2210, which is electrically connected to the input/output interconnection line 3265.

Figure 5:
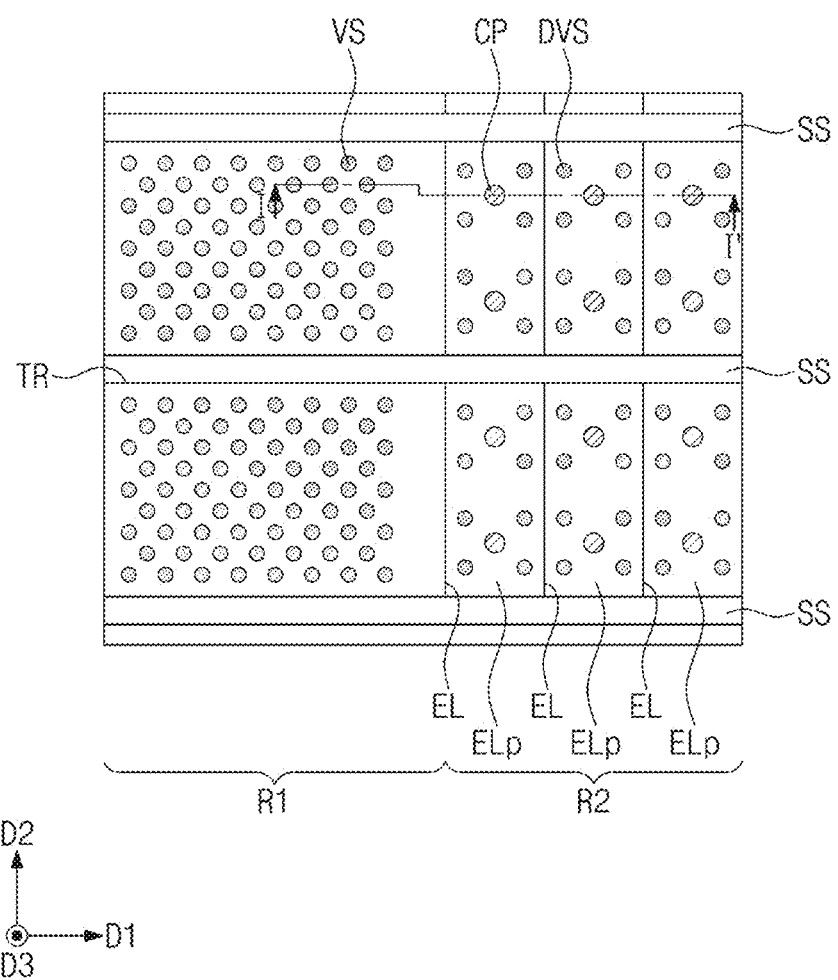
FIG. 5 is a plan view illustrating a three-dimensional semiconductor memory device according some example embodiments.
Figure 6:
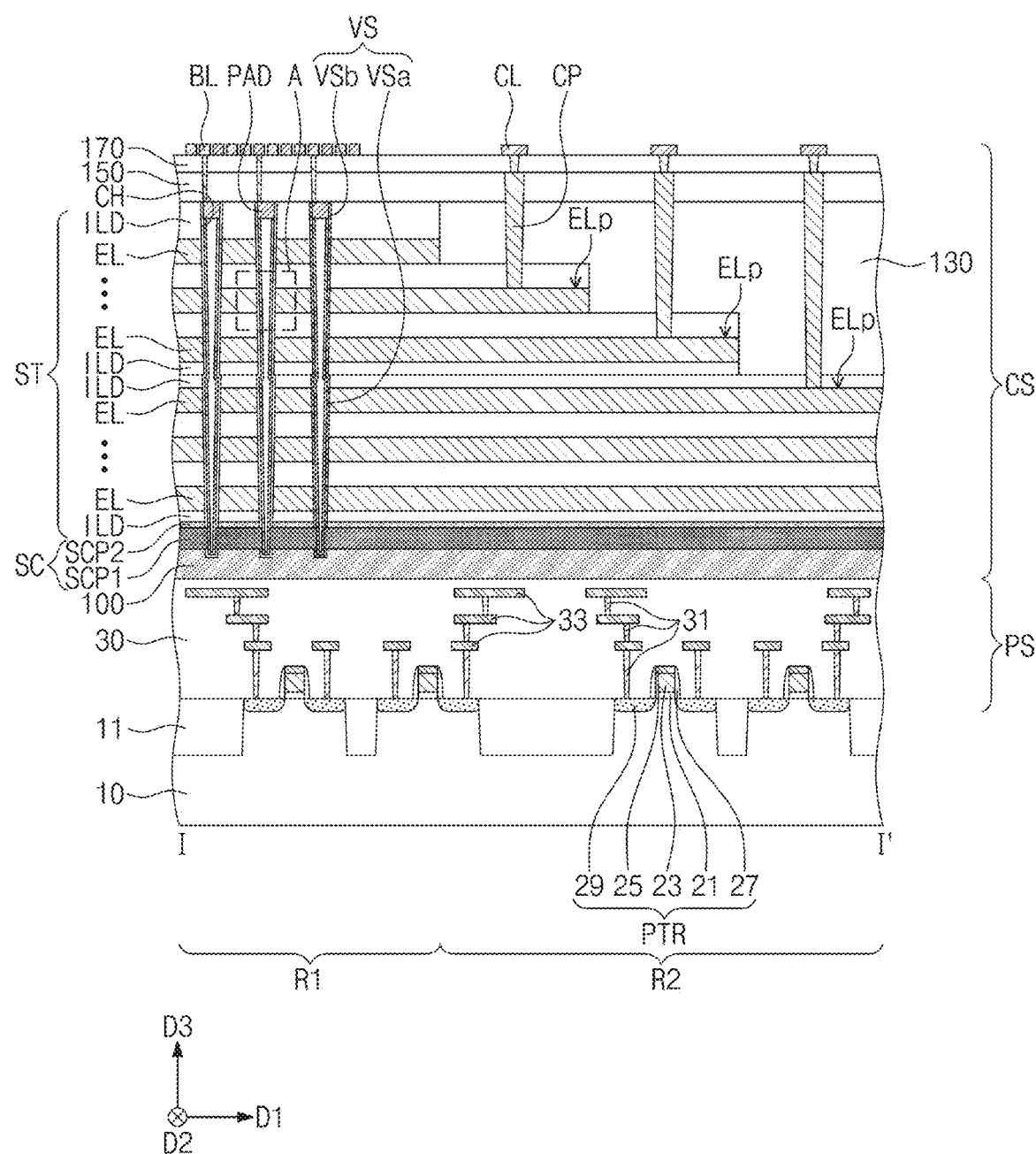
FIG. 6 is a sectional view, which is taken along a line I-I' of FIG. 5 to illustrate a three-dimensional semiconductor memory device according some example embodiments.
Figure 7:
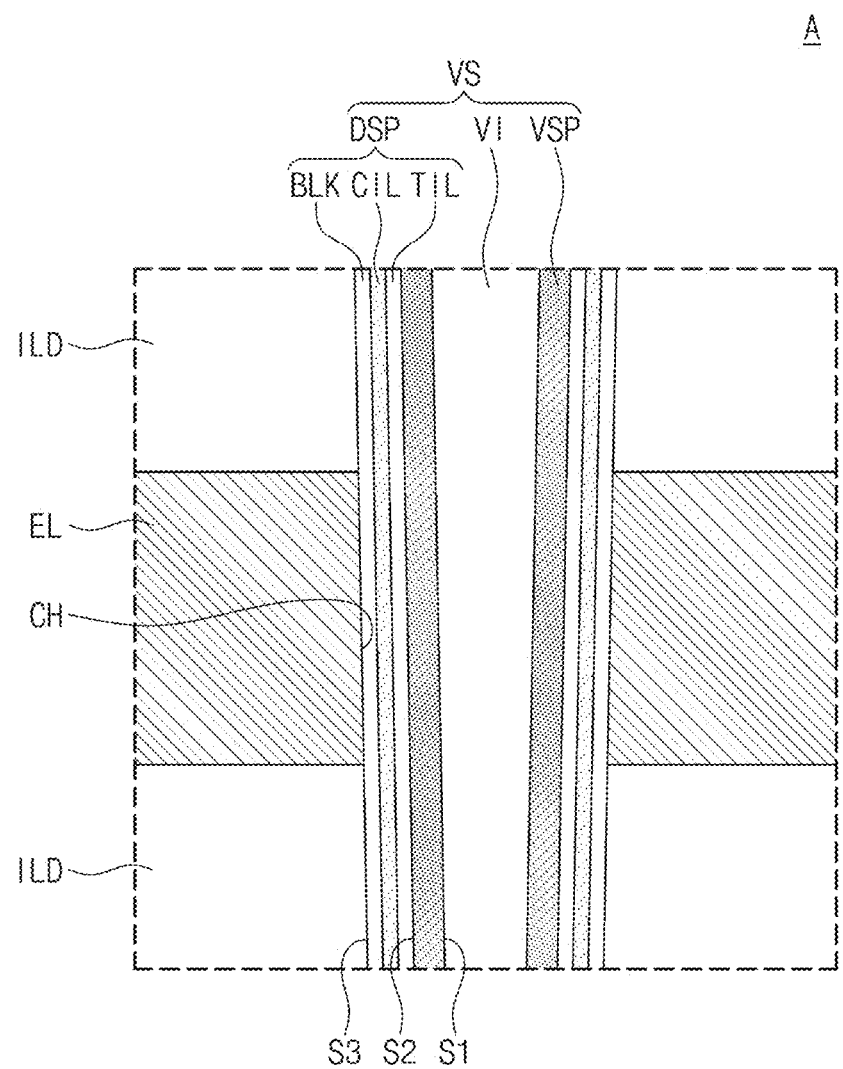
FIG. 7 is an enlarged sectional view illustrating a portion (e.g., 'A' of FIG. 6) of a three-dimensional semiconductor memory device according some example embodiments.

FIG. 5 is a plan view illustrating a three-dimensional semiconductor memory device according some example embodiments. FIG. 6 is a sectional view, which is taken along a line I-I' of FIG. 5 to illustrate a three-dimensional semiconductor memory device according some example embodiments. FIG. 7 is an enlarged sectional view illustrating a portion (e.g., 'A' of FIG. 6) of a three-dimensional semiconductor memory device according some example embodiments.

Referring to FIGS. 5, 6, and 7, a first substrate 10 including a first region R1 and a second region R2 may be provided. The first substrate 10 may be extended in a first direction D1, which is oriented from the first region R1 toward the second region R2, and in a second direction D2, which is not parallel to the first direction D1. A top surface of the first substrate 10 may be perpendicular to a third direction D3, which is not parallel to the first and second directions D1 and D2. For example, the first direction D1, the second direction D2, and the third direction D3 may each be orthogonal to one another. The third direction D3 may be referred to as a vertical direction. The first and second directions D1 and D2 may be referred to as horizontal directions.

The second region R2 may extend from the first region R1 in the first direction D1. The first region R1 may be a region in which the vertical channel structures 3220, the separation structures 3230, and the bit lines 3240 described with reference to FIGS. 3 and 4 are provided. The second region R2 may be a region in which a staircase structure including pad portions ELp to be described below is provided.

In some example embodiments, the first substrate 10 may be or may include a silicon substrate, a silicon germanium substrate, a germanium substrate, or a structure including a single-crystalline silicon substrate and a single-crystalline epitaxial layer grown therefrom. The first substrate 10 may be doped, e.g. may be lightly doped; however, example embodiments are not limited thereto. A device isolation layer 11 may be provided in the first substrate 10. The device isolation layer 11 may define an active region of the first substrate 10. The device isolation layer 11 may be formed of or include, for example, silicon oxide.

A peripheral circuit structure PS may be provided on the first substrate 10. The peripheral circuit structure PS may include peripheral circuit transistors PTR on the active region of the first substrate 10, peripheral circuit contact plugs 31, peripheral circuit interconnection lines 33 electrically connected to the peripheral circuit transistors PTR through the peripheral circuit contact plugs 31, and a first insulating layer 30 enclosing them. The peripheral circuit structure PS may correspond to the first region 1100F of FIG. 1, and the peripheral circuit interconnection lines 33 may correspond to the peripheral lines 3110 of FIGS. 3 and 4.

The peripheral circuit transistors PTR, the peripheral circuit contact plugs 31, and the peripheral circuit interconnection lines 33 may constitute or correspond to a peripheral circuit. For example, the peripheral circuit transistors PTR may constitute or correspond to the decoder circuit 1110, the page buffer 1120, and the logic circuit 1130 of FIG. 1. More specifically, each of the peripheral circuit transistors PTR may include a peripheral gate insulating layer 21, a peripheral gate electrode 23, a peripheral capping pattern 25, a peripheral gate spacer 27, and peripheral source/drain regions 29.

The peripheral gate insulating layer 21 may be provided between the peripheral gate electrode 23 and the first substrate 10. The peripheral capping pattern 25 may be provided on the peripheral gate electrode 23. The peripheral gate spacer 27 may cover side surfaces of the peripheral gate insulating layer 21, the peripheral gate electrode 23, and the peripheral capping pattern 25. The peripheral source/drain regions 29 may be provided in portions of the first substrate 10, which are located at both sides of the peripheral gate electrode 23.

The peripheral circuit interconnection lines 33 may be electrically connected to the peripheral circuit transistors PTR through the peripheral circuit contact plugs 31. One or more of the peripheral circuit transistors PTR may be an NMOS transistor, and one or more of the transistors PTR may be a PMOS transistor and, in some example embodiments, one or more of the peripheral circuit transistors PTR may be a gate-all-around type transistor. As an example, widths of the peripheral circuit contact plugs 31 may increase with increasing distance from the first substrate 10. The peripheral circuit contact plugs 31 and the peripheral circuit interconnection lines 33 may be formed of or include at least one of conductive materials (e.g., metallic materials such as but not limited to tungsten or polysilicon such as doped poly silicon).

The first insulating layer 30 may be provided on the top surface of the first substrate 10. The first insulating layer 30 may be provided on the first substrate 10 to cover the peripheral circuit transistors PTR, the peripheral circuit contact plugs 31, and the peripheral circuit interconnection lines 33. The first insulating layer 30 may be a multi-layered structure including a plurality of insulating layers. For example, the first insulating layer 30 may be formed of or include at least one of silicon oxide, silicon nitride, silicon oxynitride, and/or low-k dielectric materials.

A cell array structure CS including a second substrate 100, a stack structure ST, separation structures SS, vertical channel structures VS, and contact plugs CP may be provided on the peripheral circuit structure PS. Hereinafter, the cell array structure CS will be described in more detail below.

The second substrate 100 may be provided on the first and second regions R1 and R2 and on the first insulating layer 30. The second substrate 100 may be extended in the first and second directions D1 and D2. The second substrate 100 may be a semiconductor substrate including a semiconductor material. The second substrate 100 may be formed of or include at least one of silicon (Si), germanium (Ge), silicon germanium (SiGe), gallium arsenic (GaAs), indium gallium arsenic (InGaAs), or aluminum gallium arsenic (AlGaAs), and may or may not be formed of or include the same material as that of the first substrate 10.

The stack structure ST may be provided on the second substrate 100. The stack structure ST may be extended from the first region R1 toward the second region R2 or in the first direction D1. The stack structure ST may correspond to the stacks 3210 of FIGS. 3 and 4.

In some example embodiments, the three-dimensional semiconductor memory device may include a plurality of stack structures ST arranged in the second direction D2. When viewed in a plan view, the separation structures SS may be provided in trenches TR, which are provided between the stack structures ST and are extended in the first direction D1. The separation structures SS may be extended from the first region R1 to the second region R2. The stack structures ST may be spaced apart from each other, in the second direction D2, with one of the separation structures SS interposed therebetween.

For convenience in description, one of the stack structures ST and one of the separation structures SS will be described in more detail below, but the others of the stack structures ST and the others of the separation structures SS may be configured to have the same or similar features.

The stack structure ST may include interlayer dielectric layers ILD and gate electrodes EL, which are alternately and repeatedly stacked. A number of layers of the interlayer dielectric layers ILD and the gate electrodes EL may be the same as, or different form, those illustrated in the figures. A thickness of the interlayer dielectric layers ILD may be variable, and may be the same or different from one another. A thickness of the gate electrodes EL may variable, and may be the same or different from one another. The gate electrodes EL may correspond to the word lines WL, the first lines LL1 and LL2, and the second lines UL1 and UL2 of FIG. 1.

Lengths of the gate electrodes EL in the first direction D1 may decrease as a distance from the second substrate 100 (i.e., a height in the third direction D3) increases. For example, a length of each of the gate electrodes EL in the first direction D1 may be larger than a length of another gage electrode thereon in the first direction D1. When measured in the first direction D1, the lowermost one of the gate electrodes EL may have the longest length, and the uppermost one of the gate electrodes EL may have the shortest length; however, example embodiments are not limited thereto.

The gate electrodes EL may have the pad portions ELp, which are provided on the second region R2. The pad portions ELp of the gate electrodes EL may be disposed at different positions in horizontal and vertical directions. The pad portions ELp may form the staircase structure in the first direction D1. Due to the staircase structure, the stack structure ST may have a decreasing thickness with increasing distance from the outermost one of the vertical channel structures VS, and when viewed in a plan view, side surfaces of the gate electrodes EL may be spaced apart from each other in the first direction D1 by a specific distance.

The gate electrodes EL may be formed of or include at least one of, for example, doped semiconductor materials (e.g., doped silicon and so forth), metallic materials (e.g., tungsten, copper, aluminum, and so forth), conductive metal nitrides (e.g., titanium nitride, tantalum nitride, and so forth), or transition metals (e.g., titanium, tantalum, and so forth). Each of the gate electrodes EL may be formed of or include the same material, or at least one of the gate electrodes EL may be formed of or include different materials than others of the gate electrodes EL.

The interlayer dielectric layers ILD may be provided between the gate electrodes EL. For example, similar to the gate electrodes EL, lengths of the interlayer dielectric layers ILD in the first direction D1 may decrease with increasing distance from the second substrate 100. In some example embodiments, a thickness of each of the interlayer dielectric layers ILD may be smaller than a thickness of each of the gate electrodes EL. As used herein, the thickness of an element may mean a length of the element measured in the third direction D3. In some example embodiments, a thickness of the lowermost one of the interlayer dielectric layers ILD may be smaller than a thickness of each of the remaining interlayer dielectric layers ILD. In some example embodiments, a thickness of the uppermost one of the interlayer dielectric layers ILD may be larger than a thickness of each of the remaining interlayer dielectric layers ILD. However, inventive concepts are not limited to this example, and the thicknesses of the interlayer dielectric layers ILD may be variously changed depending on requirements for the semiconductor device.

The interlayer dielectric layers ILD may be formed of or include at least one of, for example, silicon oxide, silicon nitride, silicon oxynitride, and/or low-k dielectric materials. For example, the interlayer dielectric layers ILD may be formed of or include at least one of high density plasma (HDP) oxide or tetraethylorthosilicate (TEOS). Each of the interlayer dielectric layers ILD may be formed of or include the same material, or at least one of the interlayer dielectric layers ILD may be formed of or include different materials than others of the interlayer dielectric layers ILD.

A source structure SC may be provided between the second substrate 100 and the stack structure ST. The second substrate 100 and the source structure SC may correspond to the common source line CSL of FIG. 1 and the common source line 3205 of FIGS. 3 and 4.

The source structure SC may be extended parallel to the gate electrodes EL of the stack structure ST or in the first and second directions D1 and D2. The source structure SC may include a first source conductive pattern SCP1 and a second source conductive pattern SCP2 which are sequentially stacked. The second source conductive pattern SCP2 may be provided between the first source conductive pattern SCP1 and the lowermost one of the interlayer dielectric layers ILD. A thickness of the first source conductive pattern SCP1 may be larger than a thickness of the second source conductive pattern SCP2. Each of the first and second source conductive patterns SCP1 and SCP2 may include a doped semiconductor material. In some example embodiments, an impurity concentration of the first source conductive pattern SCP1 may be higher than or greater than an impurity concentration of the second source conductive pattern SCP2.

The vertical channel structures VS may be provided on the first region R1 to penetrate the stack structure ST and the source structure SC and to be in contact with the second substrate 100. The vertical channel structures VS may be provided to penetrate at least a portion of the second substrate 100 and may have a bottom surface that is located at a level lower than the top surface of the second substrate 100 and the bottom surface of the source structure SC.

The vertical channel structures VS may be arranged to form a zigzag shape in the first or second direction D1 or D2, when viewed in a plan view. The vertical channel structures VS may not be provided on the second region R2. The vertical channel structures VS may correspond to the vertical channel structures 3220 of FIGS. 2 to 4. The vertical channel structures VS may correspond to the channel regions of the first transistors LT1 and LT2, the memory cell transistors MCT, and the second transistors UT1 and UT2 of FIG. 1.

The vertical channel structures VS may be provided in vertical channel holes CH, respectively, which are formed to penetrate the stack structure ST. Each of the vertical channel structures VS may include a lower vertical channel structure VSa and an upper vertical channel structure VSb on the lower vertical channel structure VSa. The lower vertical channel structure VSa may extend in the third direction D3 and may be connected to the upper vertical channel structure VSb.

Each of the upper and lower the vertical channel structures VSb and VSa may have an increasing width as a height in the third direction D3 increases. In some example embodiments, the topmost width of the lower vertical channel structure VSa may be larger than or greater than the bottommost width of the upper vertical channel structure VSb. For example, a side surface of each of the vertical channel structures VS may have a stepwise shape near a boundary between the lower vertical channel structure VSa and the upper vertical channel structure VSb. However, inventive concepts are not limited to this example. For example, the side surface of each of the vertical channel structures VS may have three or more stepwise portions located at different levels or may have a flat shape without a stepwise portion, unlike that illustrated in the drawings.

Each of the vertical channel structures VS may include a data storage pattern DSP, which is adjacent to the stack structure ST (e.g., covering an inner side surface of each of the vertical channel holes CH), a vertical semiconductor pattern VSP, which is provided to conformally cover an inner side surface of the data storage pattern DSP, a gapfill insulating pattern VI, which is provided to fill an internal space delimited by the vertical semiconductor pattern VSP, and a conductive pad, which is provided on the gapfill insulating pattern VI and the vertical semiconductor pattern VSP and is provided in a space delimited by the data storage pattern DSP. In some example embodiments, a top surface of each of the vertical channel structures VS may have a circular, elliptical, or bar shape, and may have the same shape as each other or may have a different shape from others.

The vertical semiconductor pattern VSP may be provided between the data storage pattern DSP and the gapfill insulating pattern VI. The vertical semiconductor pattern VSP may be shaped like a bottom-closed pipe or macaroni. In some example embodiments, the vertical semiconductor pattern VSP may be in contact with a portion of the source structure SC. In some example embodiments, the vertical semiconductor pattern VSP may be formed of or include germanium-doped polysilicon or polysilicon germanium (p-SiGe).

The data storage pattern DSP may be shaped like a bottom-opened pipe or macaroni. The data storage pattern DSP may include a plurality of insulating layers which are sequentially stacked.

For example, the data storage pattern DSP may include a blocking insulating layer BLK, a charge storing layer CIL, and a tunneling insulating layer TIL, which are sequentially stacked. The blocking insulating layer BLK may be provided to cover an inner side surface of each of the vertical channel holes CH. The tunneling insulating layer TIL may be provided adjacent to the vertical semiconductor pattern VSP. The charge storing layer CIL may be interposed between the blocking insulating layer BLK and the tunneling insulating layer TIL.

The blocking insulating layer BLK, the charge storing layer CIL, and the tunneling insulating layer TIL may extend from a region between the stack structure ST and the vertical semiconductor pattern VSP in the third direction D3. In some example embodiments, the Fowler-Nordheim (FN) tunneling phenomenon, which is caused by a voltage difference between the vertical semiconductor pattern VSP and the gate electrodes EL, may be used to store or change data in the data storage pattern DSP. For example, the blocking insulating layer BLK may be formed of or include silicon oxide, the charge storing layer CIL may be formed of or include silicon nitride and/or silicon oxynitride, and the tunneling insulating layer TIL may be formed of or include silicon oxide and/or aluminum oxide.

The first source conductive pattern SCP1 of the source structure SC may be in contact with the vertical semiconductor pattern VSP, and the second source conductive pattern SCP2 may be spaced apart from the vertical semiconductor pattern VSP with the data storage pattern DSP interposed therebetween. The first source conductive pattern SCP1 may be spaced apart from the gapfill insulating pattern VI with the vertical semiconductor pattern VSP interposed therebetween.

In some example embodiments, the gapfill insulating pattern VI may be formed of or include silicon oxide. The conductive pad PAD may be formed of or include at least one of doped semiconductor materials or conductive materials.

A plurality of dummy vertical channel structures DVS may be provided on the second region R2 to penetrate a second insulating layer 130, which will be described below, the stack structure ST, and the source structure SC. More specifically, the dummy vertical channel structures DVS may be provided to penetrate the pad portions ELp of the gate electrodes EL. The dummy vertical channel structures DVS may be provided near the contact plugs CP to be described below. The dummy vertical channel structures DVS may not be provided on the first region RE The dummy vertical channel structures DVS and the vertical channel structures VS may be formed at the same time and may have substantially the same structure. The dummy vertical channel structures DVS may not be electrically active during operation of the semiconductor device, and instead may provide structural or mechanical support, and/or may ease the process of fabrication of the semiconductor device; however, example embodiments are not limited thereto. In some example embodiments, the dummy vertical channel structures DVS may not be provided.

A second insulating layer 130 may be provided on the second region R2 to cover the staircase structure of the stack structure ST. The second insulating layer 130 may have a substantially flat top surface. A top surface of the second insulating layer 130 may be substantially coplanar with the topmost surface of the stack structure ST (e.g., the top surface of the uppermost one of the interlayer dielectric layers ILD).

A third insulating layer 150 and a fourth insulating layer 170 may be sequentially stacked on the stack structure ST and the second insulating layer 130. Each of the second to fourth insulating layers 130, 150, and 170 may be formed of or include at least one of insulating materials (e.g., silicon oxide, silicon nitride, silicon oxynitride, and/or low-k dielectric materials).

The separation structure SS may be provided to penetrate the third insulating layer 150, the stack structure ST, and the source structure SC. The separation structure SS may further penetrate the second insulating layer 130 on the second region R2. The separation structure SS may be spaced apart from the vertical channel structures VS in the second direction D2.

The contact plugs CP may be provided on the second region R2 to penetrate the second and third insulating layers 130 and 150. Each of the contact plugs CP may be provided to further penetrate one of the interlayer dielectric layers ILD of the stack structures ST and may be in contact with and electrically connected to one of the gate electrodes EL. The contact plugs CP may be provided on the pad portions ELp. The contact plugs CP may be spaced apart from the dummy vertical channel structures DVS. A height of each of the contact plugs CP in the third direction D3 may increase as a distance from the outermost one of the vertical channel structures VS increases. The contact plugs CP may correspond to the gate interconnection lines 3235 of FIG. 4. Each of the contact plugs CP may have an increasing width as a height in the third direction D3 increases. The contact plugs CP may be formed of or include at least one of conductive materials (e.g., metallic materials such as tungsten and/or doped polysilicon).

Bit lines BL, which are electrically connected to the vertical channel structures VS, and conductive lines CL, which are electrically connected to the contact plugs CP, may be provided on the fourth insulating layer 170. The bit lines BL and the conductive lines CL may be formed of or include at least one of conductive materials (e.g., metallic materials such as tungsten and/or aluminum and/or polysilicon such as doped polysilicon). The bit lines BL may correspond to the bit line BL of FIG. 1 and the bit lines 3240 of FIGS. 3 and 4. The conductive lines CL may correspond to the conductive lines 3250 of FIG. 4. In some example embodiments, an additional insulating layer may be provided on the fourth insulating layer 170 to cover the bit lines BL and the conductive lines CL, and additional interconnection lines may be provided in the additional insulating layer.

Figure 8:
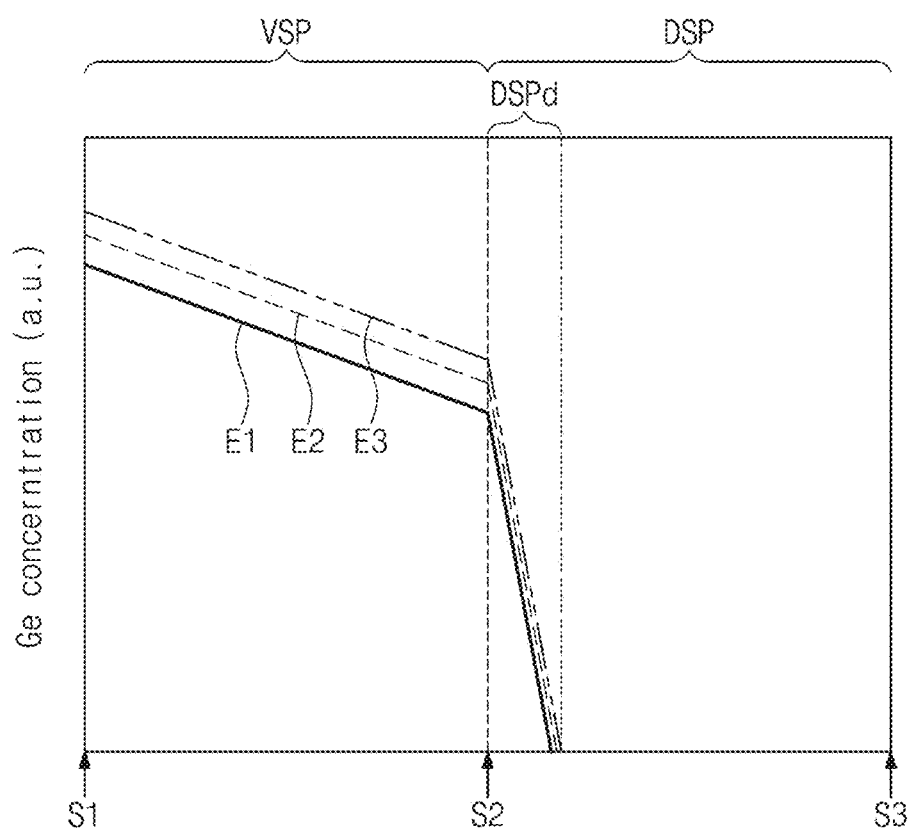
FIG. 8 is a graph showing a variation in germanium concentration of a vertical channel structure of a three-dimensional semiconductor memory device according some example embodiments.

FIG. 8 is a graph showing a variation in germanium concentration of a vertical channel structure of a three-dimensional semiconductor memory device according some example embodiments.

In FIG. 8, first to third profiles E1, E2, and E3 are results, which may be measured when a process temperature and/or a duration time of a thermal treatment process, to be described below, are changed. The first to third profiles E1, E2, and E3 may be obtained using an appropriate method, such as but not limited to secondary ion mass spectrometry and/or transmission electron microscopy. In FIG. 8, the vertical axis may be in arbitrary units, and may or may not be linear, e.g., may be logarithmic; however, example embodiments are not limited thereto. The first profile E1 is a result of the thermal treatment process performed at about 600° C. for about 1 hours, the second profile E2 is a result of the thermal treatment process performed at about 600° C. for about 24 hours, and the third profile E3 is a result of the thermal treatment process performed at about 700° C. for about 24 hours.

Referring to FIGS. 7 and 8, an interface between the vertical semiconductor pattern VSP and the gapfill insulating pattern VI may be referred to as a first interface or first surface S1, an interface between the vertical semiconductor pattern VSP and the data storage pattern DSP may be referred to as a second interface or second surface S2, and an interface between the vertical semiconductor pattern VSP and the data storage pattern DSP may be referred to as a third interface or third surface S3. For example, the vertical semiconductor pattern VSP may have the first surface S1, which is in contact with the gapfill insulating pattern VI, and the second surface S2, which is in contact with the data storage pattern DSP. In addition, the data storage pattern DSP may have the second surface S2, which is in contact with the vertical semiconductor pattern VSP, and the third surface S3, which is in contact with the interlayer dielectric layers ILD (or the gate electrodes EL).

A germanium concentration in the vertical semiconductor pattern VSP may decrease in a direction from the first surface S1 toward the second surface S2. The data storage pattern DSP may include a diffusion region DSPd that is adjacent to the vertical semiconductor pattern VSP. The diffusion region DSPd may contain germanium. A germanium concentration in the diffusion region DSPd may decrease in a direction from the second surface S2 toward the third surface S3 and may become zero at a point or position or region between the second surface S2 and the third surface S3. The point having the vanishing germanium concentration may be closer to the second surface S2 than to the third surface S3. An absolute value of the reduction rate of the germanium concentration in the diffusion region DSPd may be greater than an absolute value of the reduction rate of the germanium concentration in the vertical semiconductor pattern VSP.

Figure 9:
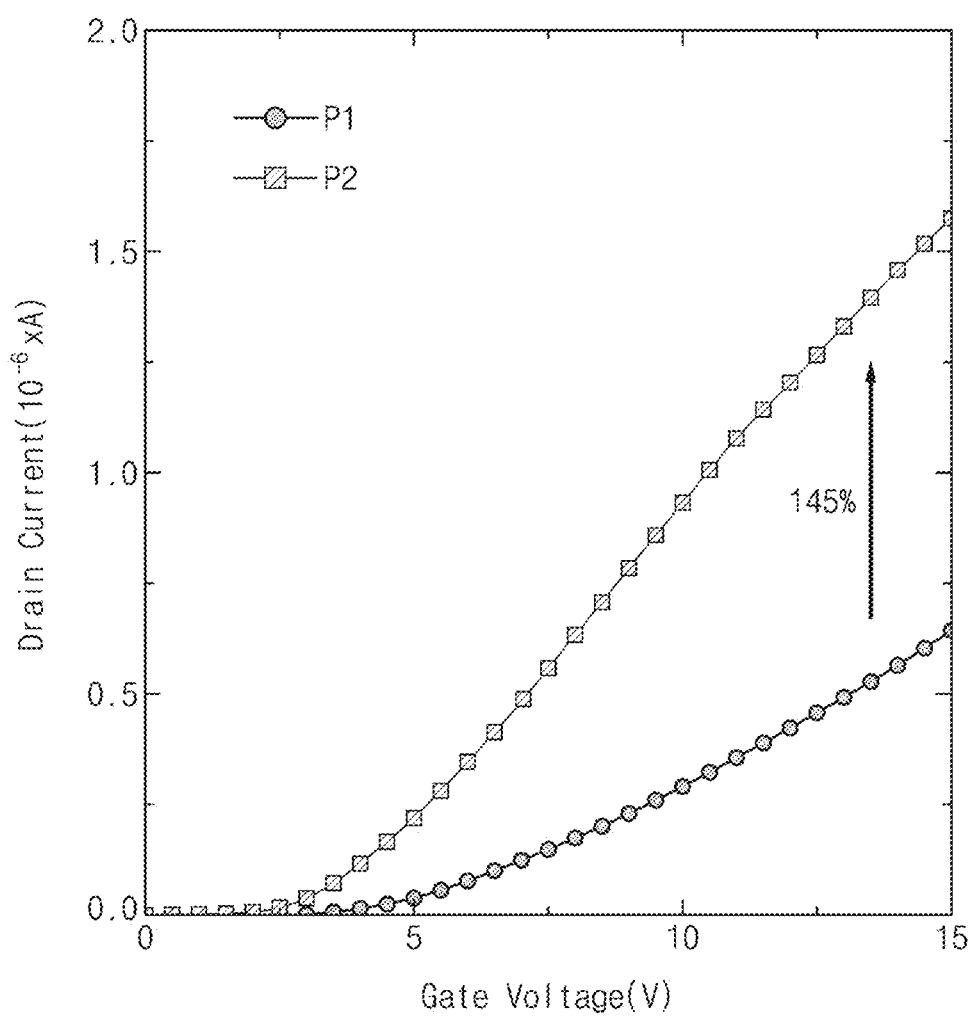
FIGS. 9 and 10 are graphs showing technical effects in a three-dimensional semiconductor memory device according some example embodiments.
Figure 10:
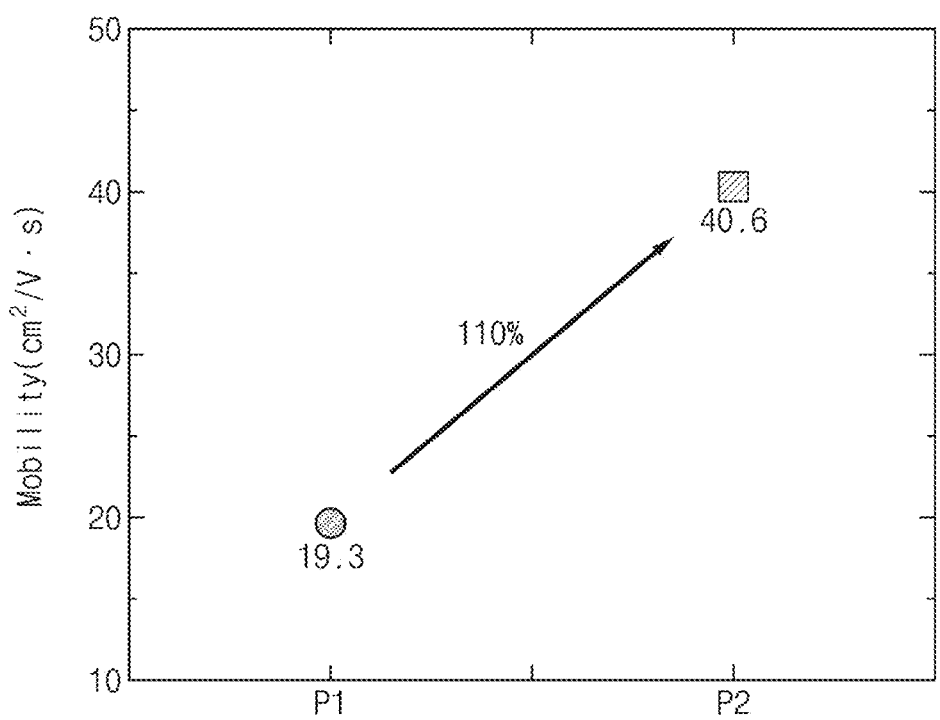

FIGS. 9 and 10 are graphs showing various technical effects in a three-dimensional semiconductor memory device according some example embodiments.

In FIGS. 9 and 10, the curve P1 shows a case in which a channel layer (e.g., the vertical semiconductor pattern VSP of FIG. 7) is formed of or includes only a germanium-free poly silicon layer, whereas the curve P2 shows a case according some example=embodiments.

When, as in various example embodiments of inventive concepts, the channel layer contains germanium atoms, the channel layer may have an increased grain size, and in this case, a transition layer (e.g., corresponding to a boundary between grains and/or a grain boundary) may be reduced, thereby causing an increase in electron mobility and/or driving current. Alternatively or additionally, if, as in various example embodiments of inventive concepts, the germanium concentration in the channel layer decreases as a distance to a data storage pattern (e.g., DSP of FIG. 7) decreases, a germanium atom may serve as a charge trap site in a region adjacent to the data storage pattern, and in this case, it may be possible to prevent and/or suppress the flow of carriers from being disturbed and thereby to increase the electron mobility and the driving current.

As shown in FIG. 9, the driving current in the embodiment of the inventive concept (i.e., P2) was increased by about 145%, compared with the case (i.e., P1) in which the channel layer was formed of only a germanium-free poly silicon layer. Here, a drain current ($10^{-6}$ A) was measured with a gate voltage of about 15V.

Referring to FIG. 10, the electron mobility in the embodiment of the inventive concept (i.e., P2) was increased by about 110%, compared with the case (l, P1) in which the channel layer was formed of only a germanium-free poly silicon layer. Here, the mobility was measured in $cm^2/V \cdot s$.

FIGS. 11 to 14 are enlarged sectional views illustrating a method of fabricating a three-dimensional semiconductor memory device, according some example embodiments, and corresponding to the portion 'A' of FIG. 6. Hereinafter, the method of fabricating a three-dimensional semiconductor memory device according some example embodiments will be described in more detail with reference to FIGS. 5 to 7 and FIGS. 11 to 14.

Referring back to FIGS. 5 and 6, the first substrate 10 including the first region R1 and the second region R2 may be provided. The device isolation layer 11 may be formed in the first substrate 10 to define an active region. The formation of the device isolation layer 11 may include forming a trench in an upper portion of the first substrate 10 and filling the trench with silicon oxide.

The peripheral circuit transistors PTR may be formed on the active region defined by the device isolation layer 11. The peripheral circuit contact plugs 31 and the peripheral circuit interconnection lines 33 may be formed on the first substrate 10 and may be connected to the peripheral source/drain regions 29 of the peripheral circuit transistors PTR. The first insulating layer 30 may be formed to cover the peripheral circuit transistors PTR, the peripheral circuit contact plugs 31, and the peripheral circuit interconnection lines 33.

The second substrate 100 may be formed on the first insulating layer 30. The stack structure ST may be formed on the second substrate 100, and here, the stack structure ST may include the interlayer dielectric layers ILD and the gate electrodes EL, which are alternately and repeatedly stacked on the second substrate 100. More specifically, the formation of the stack structure ST may include alternately and repeatedly stacking the interlayer dielectric layers ILD and sacrificial layers on the second substrate 100 using, for example, an atomic layer deposition (ALD) process, performing a trimming process on the interlayer dielectric layers ILD and the sacrificial layers to form a staircase structure on the second region R2, selectively removing the sacrificial layers, and forming the gate electrodes EL to fill spaces which are formed by removing the sacrificial layers. The selectively removing of the sacrificial layers and the forming of the gate electrodes EL may be performed before and/or after a process, which will be described below with reference to FIGS. 11 and 14.

Figure 11:
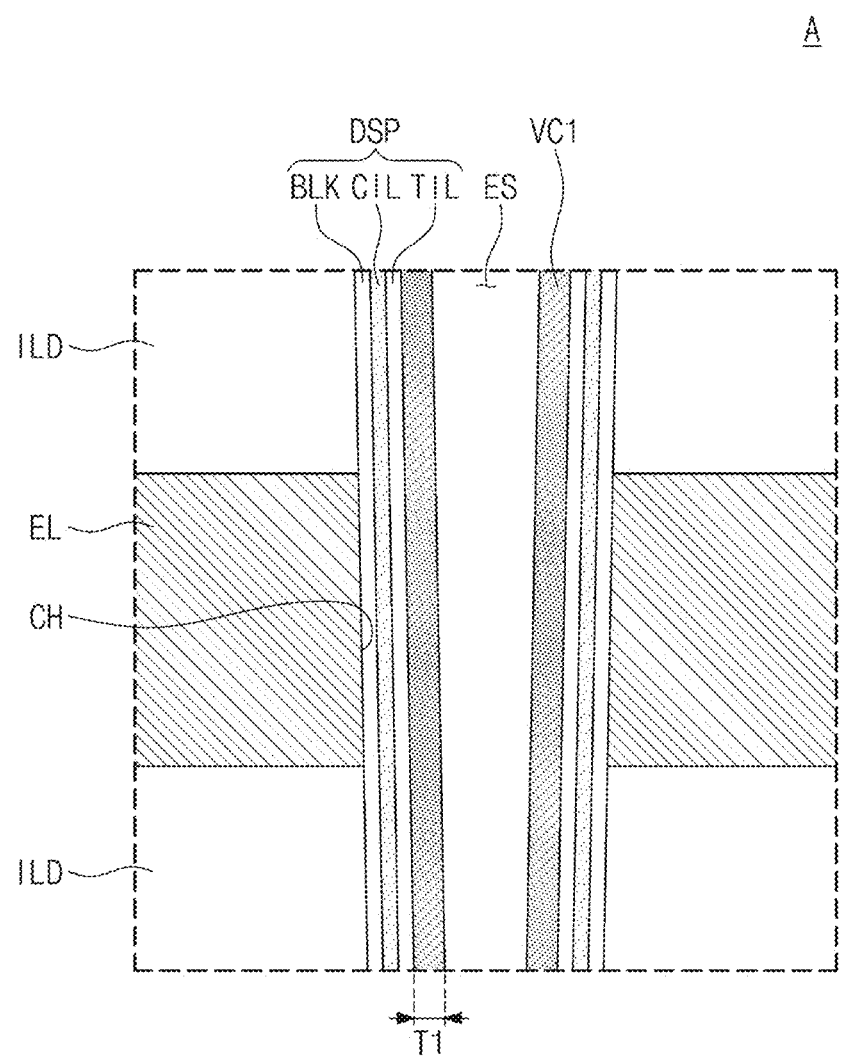
FIGS. 11 to 14 are enlarged sectional views illustrating a method of fabricating a three-dimensional semiconductor memory device, according some example embodiments, and corresponding to the portion 'A' of FIG. 6.

Referring to FIG. 11, the vertical channel holes CH may be formed to penetrate the stack structure ST, using, for example, an anisotropic etching process such as a dry etching process. Each of the vertical channel holes CH may have an increasing width as a height in the third direction D3 increases. The data storage pattern DSP may be formed to conformally cover an inner side surface of each of the vertical channel holes CH, using a conformal deposition process such as but not limited to one or more of a chemical vapor deposition (CVD) process or an ALD process. The formation of the data storage pattern DSP may include sequentially forming the blocking insulating layer BLK, the charge storing layer CIL, and the tunneling insulating layer TIL on the inner side surface of each of the vertical channel holes CH. The charge storing layer CIL may be formed of or include an insulating material that is different from the blocking insulating layer BLK and the tunneling insulating layer TIL. For example, the blocking insulating layer BLK may be formed of or include silicon oxide, the charge storing layer CIL may be formed of or include silicon nitride and/or silicon oxynitride, and the tunneling insulating layer TIL may be formed of and/or include silicon oxide or aluminum oxide.

A first vertical channel layer VC1 may be formed on an inner side surface of the tunneling insulating layer TIL. The first vertical channel layer VC1 may be formed of or include amorphous silicon (a-Si). The first vertical channel layer VC1 may be formed to have a first thickness T1. In some example embodiments, the first thickness T1 may range from about 5 nm to 20 nm. After the formation of the first vertical channel layer VC1, an empty space ES, which is delimited by or defined by the first vertical channel layer VC1, may be left in each of the vertical channel holes CH.

Figure 12:
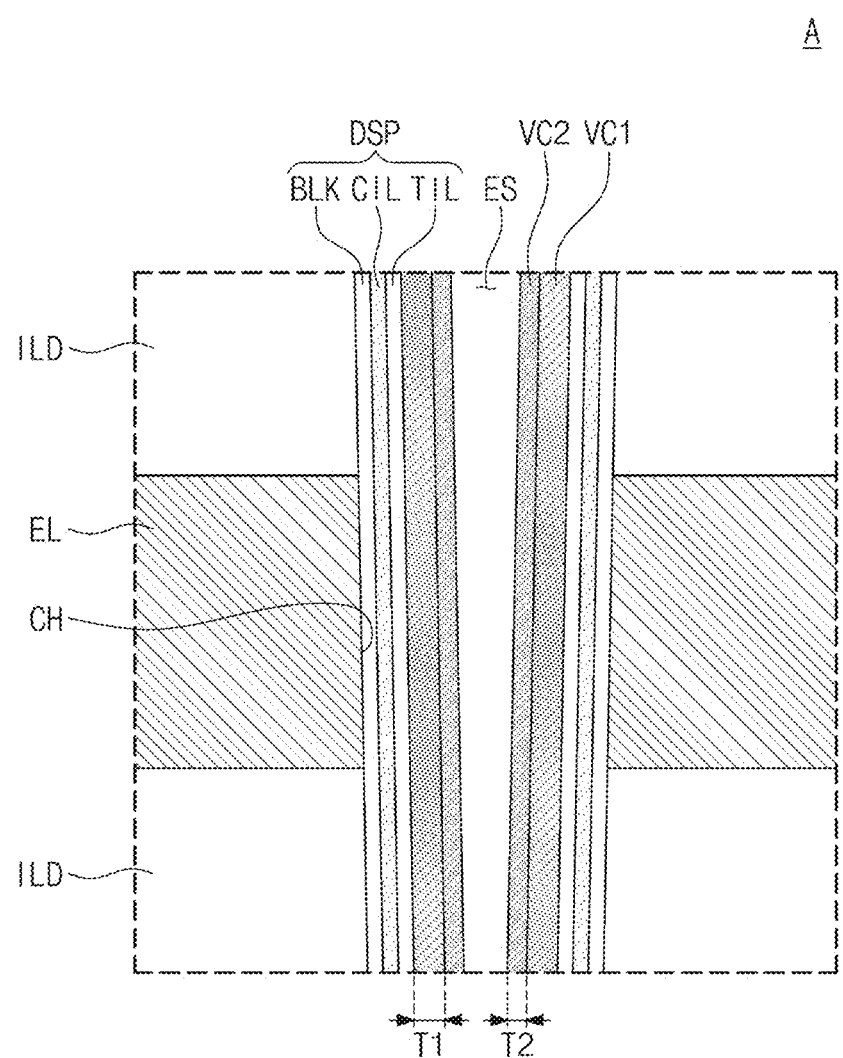

Referring to FIG. 12, a second vertical channel layer VC2 may be formed on the first vertical channel layer VC1. The second vertical channel layer VC2 may be formed of or include amorphous silicon germanium (a-SiGe), and may be deposited with a conformal deposition process such as one or both of an ALD process and a CVD process. The second vertical channel layer VC2 may be formed to have a second thickness T2. In some example embodiments, the second thickness T2 may range from about 2 nm to 40 nm. After the formation of the second vertical channel layer VC2, the empty space ES, which is delimited by the second vertical channel layer VC2, may be left in each of the vertical channel holes CH.

Figure 13:
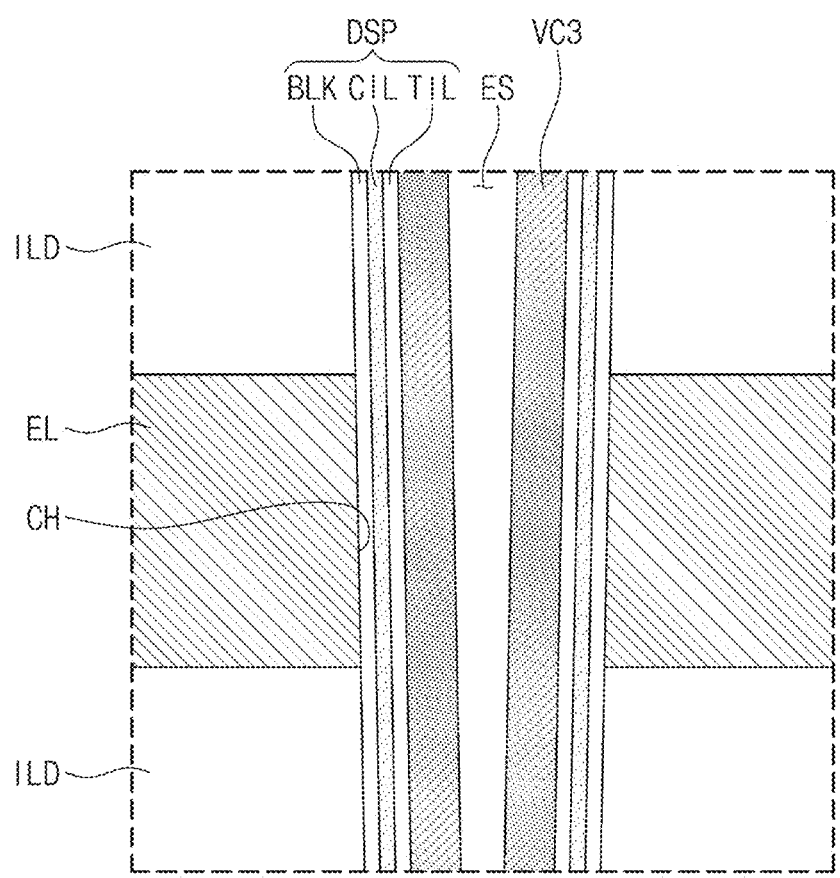

Referring to FIGS. 12 and 13, a thermal treatment process may be performed on the first and second vertical channel layers VC1 and VC2. The thermal treatment process may be or may include a process such as a furnace annealing process and/or a laser annealing process and/or a rapid thermal annealing process. As a result of the thermal treatment process, the first and second vertical channel layers VC1 and VC2 may be crystalized to form a third vertical channel layer VC3. During the thermal treatment process, germanium atoms in the second vertical channel layer VC2 may diffuse into the first vertical channel layer VC1, and thus, a germanium concentration in the third vertical channel layer VC3 may continuously decrease in a direction toward the data storage pattern DSP. A gradient of the germanium concentration in the third vertical channel layer VC3 may be changed depending on process conditions (e.g., process temperature and/or duration time) for the thermal treatment process.

The process temperature in the thermal treatment process may range from about 500° C. to 800° C. In some example embodiments, the process temperature in the thermal treatment process may range from about 550° C. to about 650° C. The duration time in the thermal treatment process may range from about 30 minutes to 24 hours. In some example embodiments, the duration time in the thermal treatment process may range from about 30 minutes to 5 hours.

Figure 14:
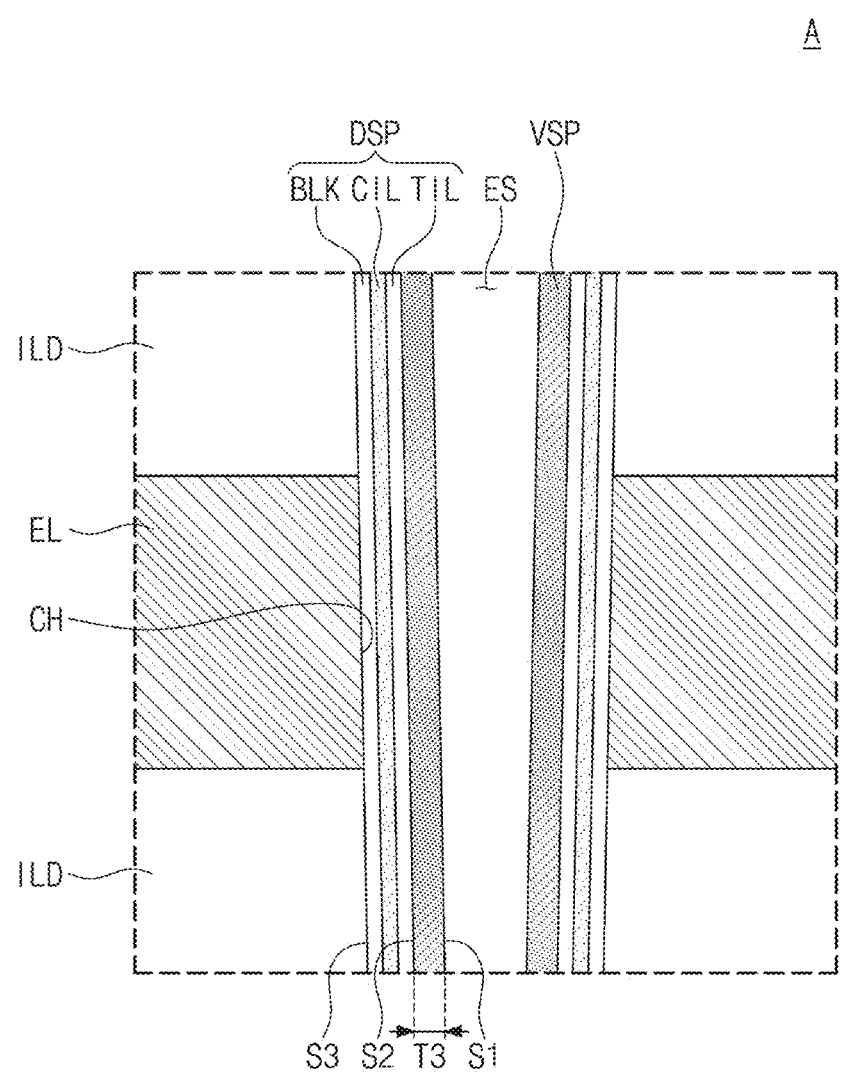

Referring to FIGS. 13 and 14, the third vertical channel layer VC3 may be partially etched to form the vertical semiconductor pattern VSP. The etching process on the third vertical channel layer VC3 may be performed to selectively remove a portion of the third vertical channel layer VC3 whose germanium concentration is higher than a specific concentration.

Referring to FIG. 14 in conjunction with FIGS. 5 to 7, the gapfill insulating pattern VI may be formed to fill the empty space ES, which is provided in each of the vertical channel holes CH and is enclosed by the vertical semiconductor pattern VSP. In some example embodiments, the gapfill insulating pattern VI may be formed of or include silicon oxide.

Thereafter, the second insulating layer 130 may be formed to cover the staircase structure of the stack structure ST. Next, the third and fourth insulating layers 150 and 170 may be sequentially formed on the second insulating layer 130 and the stack structure ST. The contact plugs CP may be formed to penetrate the second and third insulating layers 130 and 150 and to be connected to the gate electrodes EL, and bit line contact plugs may be formed to penetrate the third and fourth insulating layers 150 and 170 and to be connected to the conductive pads PAD of the vertical channel structures VS, respectively. The bit lines BL and the conductive lines CL may be formed on the fourth insulating layer 170. Here, the bit lines BL may be connected to the conductive pads PAD of the vertical channel structures VS through the bit line contact plugs, and the conductive lines CL may be connected to the gate electrodes EL through the contact plugs CP.

Figure 15:
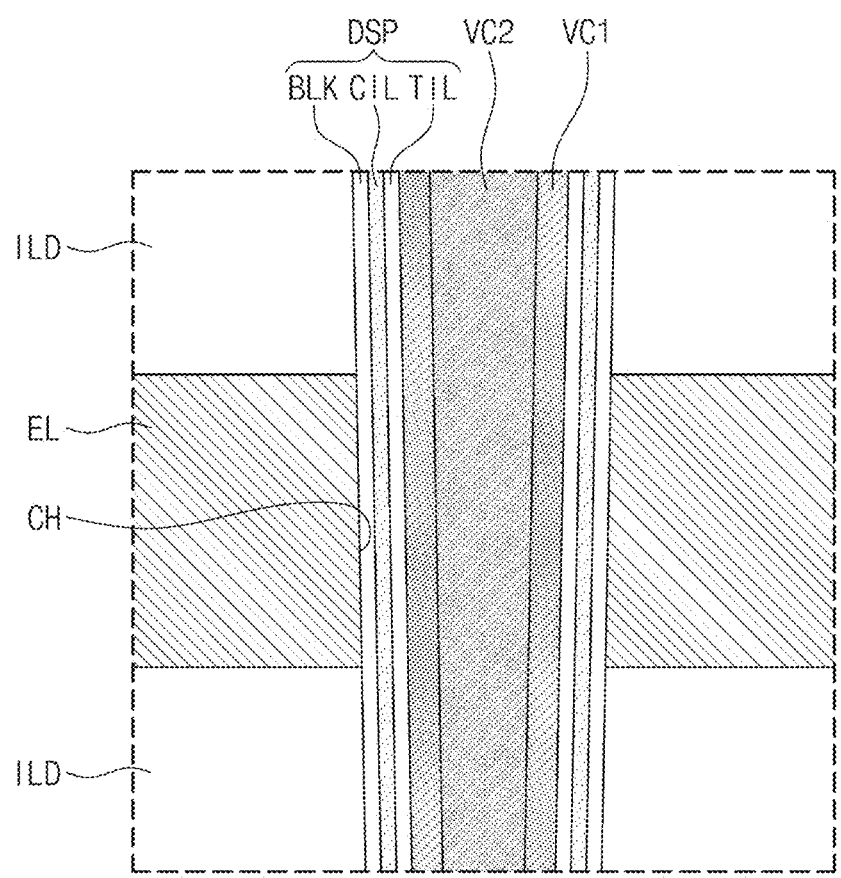
FIGS. 15 and 16 are enlarged sectional views illustrating a method of fabricating a three-dimensional semiconductor memory device, according to another embodiment of the inventive concept, and corresponding to the portion 'A' of FIG. 6.
Figure 16:
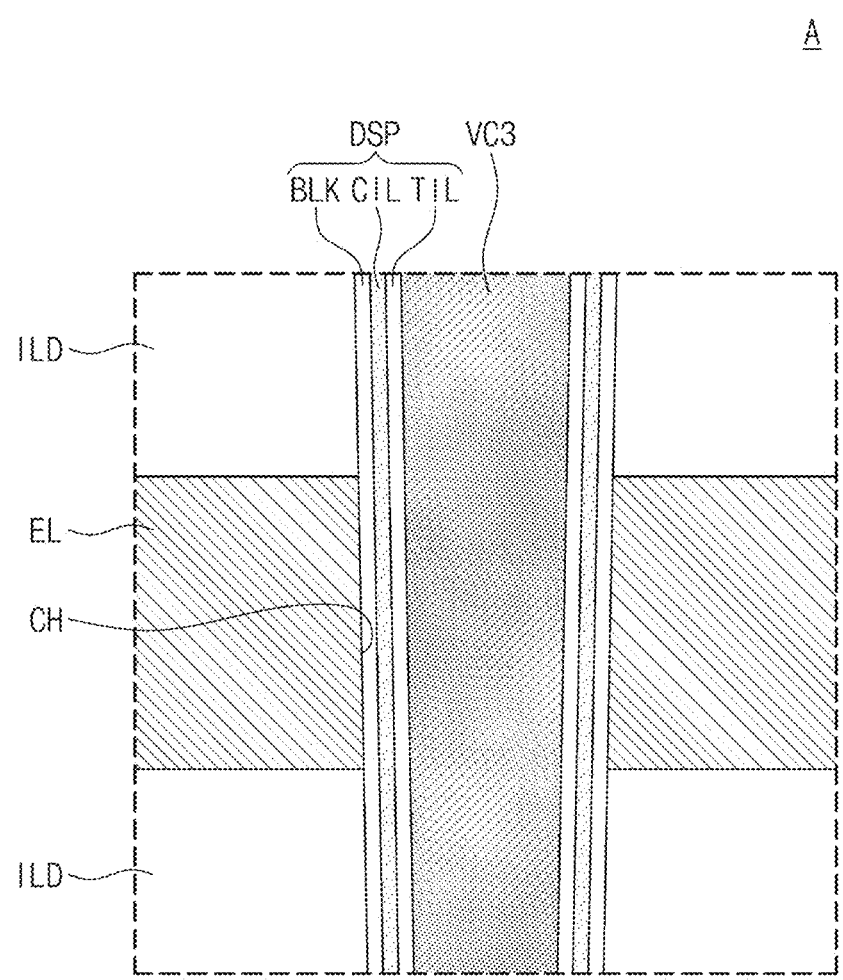

FIGS. 15 and 16 are enlarged sectional views illustrating a method of fabricating a three-dimensional semiconductor memory device, according to some example embodiments of inventive concepts, and corresponding to the portion 'A' of FIG. 6.

Referring to FIGS. 11 and 15, the second vertical channel layer VC2 may be formed on the first vertical channel layer VC1. The second vertical channel layer VC2 may be formed of or include amorphous silicon germanium (a-SiGe). The second vertical channel layer VC2 may be formed to fully fill the empty space ES in each of the vertical channel holes CH.

Referring to FIGS. 15 and 16, a thermal treatment process may be performed on the first and second vertical channel layers VC1 and VC2. As a result of the thermal treatment process, the first and second vertical channel layers VC1 and VC2 may be crystalized to form the third vertical channel layer VC3. During the thermal treatment process, germanium atoms in the second vertical channel layer VC2 may be diffused into the first vertical channel layer VC1, and thus, a germanium concentration in the third vertical channel layer VC3 may be continuously decreased in a direction toward the data storage pattern DSP.

Referring to FIG. 16 in conjunction with FIG. 14, the third vertical channel layer VC3 may be partially etched to form the vertical semiconductor pattern VSP. The etching process on the third vertical channel layer VC3 may be performed to selectively remove a portion of the third vertical channel layer VC3 whose germanium concentration is higher than a predetermined reference concentration.

Figure 17:
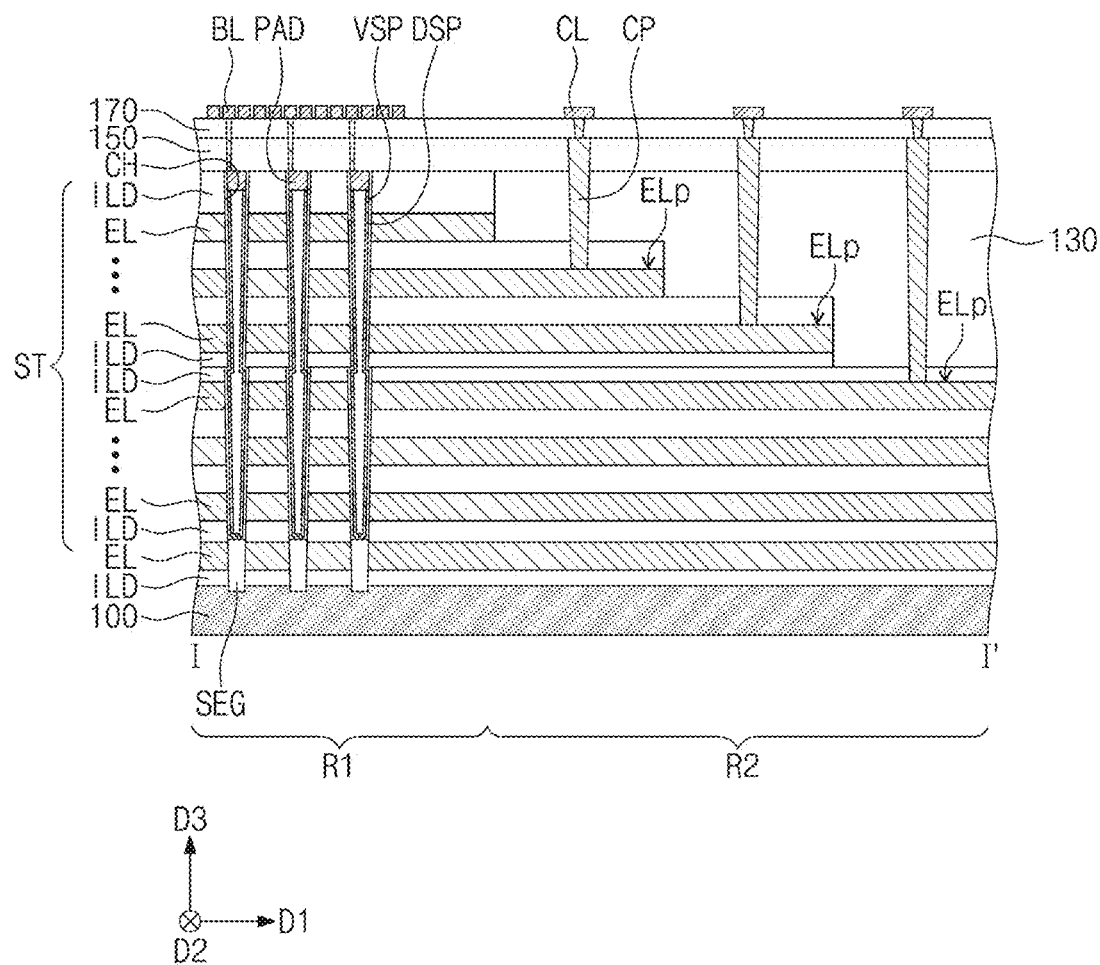
FIGS. 17 and 18 are sectional views illustrating a three-dimensional semiconductor memory device according some example embodiments.

FIG. 17 is a sectional view illustrating a three-dimensional semiconductor memory device according some example embodiments. In the following description, an element previously described with reference to FIGS. 5, 6, and 7 may be identified by the same reference number without repeating an overlapping description thereof, for concise description.

Referring to FIGS. 5 and 17, a peripheral circuit may not be provided below the second substrate 100 and may be provided on a region, which is spaced apart from the first and second regions R1 and R2 in a horizontal direction (e.g., the first or second direction D1 or D2).

The vertical channel structures VS and the stack structure ST may be provided on the second substrate 100. Each of the vertical channel structures VS may include an epitaxial pattern SEG, which is provided in a lower portion of each of the vertical channel holes CH and is in contact with the second substrate 100, the vertical semiconductor pattern VSP, which is provided to be in contact with the epitaxial pattern SEG, and the data storage pattern DSP, which is interposed between the stack structure ST and the vertical semiconductor pattern VSP and covers an inner side surface of each of the vertical channel holes CH. The epitaxial pattern SEG may overlap with one of the gate electrodes EL in the horizontal direction, but the inventive concept is not limited to this example. The data storage pattern DSP may be extended from a region between the stack structure ST and the vertical semiconductor pattern VSP in the third direction D3. A portion of the data storage pattern DSP may be extended from a region between the vertical semiconductor pattern VSP and the epitaxial pattern SEG in the horizontal direction. The vertical semiconductor pattern VSP may be shaped like a bottom-opened pipe or macaroni.

Figure 18:
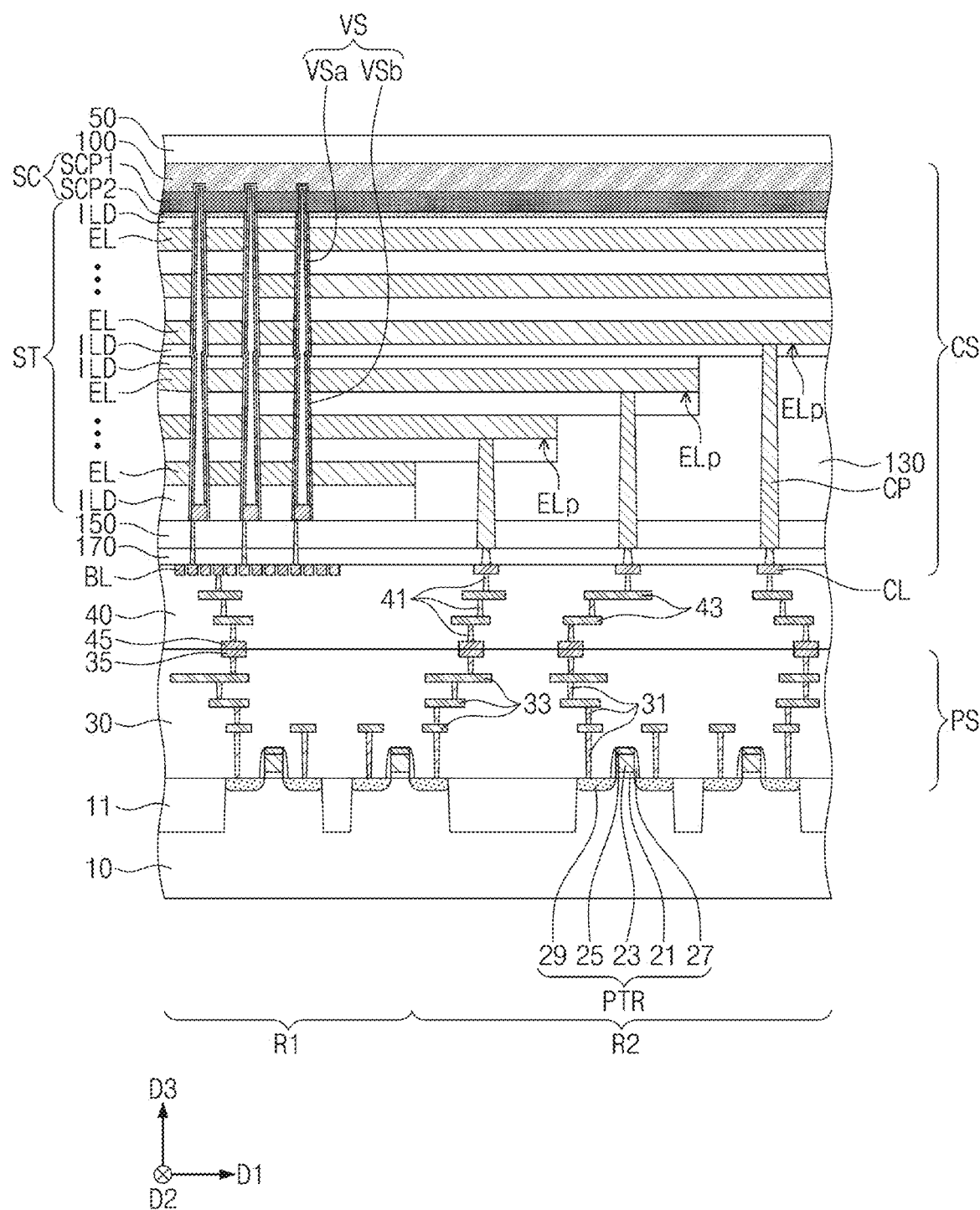

FIG. 18 is a sectional view illustrating a three-dimensional semiconductor memory device according some example embodiments. In the following description, an element previously described with reference to FIGS. 5, 6, and 7 may be identified by the same reference number without repeating an overlapping description thereof, for concise description.

Referring to FIG. 18, the peripheral circuit structure PS may be provided on the first substrate 10, and here, the peripheral circuit structure PS may include the peripheral circuit transistors PTR, the peripheral circuit contact plugs 31, the peripheral circuit interconnection lines 33 electrically connected to the peripheral circuit transistors PTR through the peripheral circuit contact plugs 31, first bonding pads 35 electrically connected to the peripheral circuit interconnection lines 33, and the first insulating layer 30 enclosing them. The first bonding pads 35 may be electrically connected to the peripheral circuit transistors PTR through the peripheral circuit contact plugs 31. The first insulating layer 30 may not cover top surfaces of the first bonding pads 35. The first insulating layer 30 may have a top surface that is substantially coplanar with the top surfaces of the first bonding pads 35.

Second bonding pads 45 in contact with the first bonding pads 35 of the peripheral circuit structure PS, connection contact plugs 41, connection circuit interconnection lines 43 electrically connected to the second bonding pads 45 through the connection contact plugs 41 and a fifth insulating layer 40 enclosing them may be provided on the first insulating layer 30. The fifth insulating layer 40 may have a multi-layered structure including a plurality of insulating layers.

The connection contact plugs 41 may have a decreasing width as a height in the third direction D3 increases. The connection contact plugs 41 and the connection circuit interconnection lines 43 may be formed of or include at least one of conductive materials (e.g., metallic materials).

The fifth insulating layer 40 may not cover bottom surfaces of the second bonding pads 45. A bottom surface of the fifth insulating layer 40 may be substantially coplanar with the bottom surfaces of the second bonding pads 45. A bottom surface of each of the second bonding pads 45 may be in direct contact with a top surface of each of the first bonding pads 35. The first and second bonding pads 35 and 45 may be formed of or include at least one of metallic materials (e.g., copper (Cu), tungsten (W), aluminum (Al), nickel (Ni), or tin (Sn)). As an example, the first and second bonding pads 35 and 45 may be formed of or include copper (Cu). The first and second bonding pads 35 and 45 may be connected to each other without any interface therebetween and may form a single object. The side surfaces of the first and second bonding pads 35 and 45 are illustrated to be aligned to each other, but the inventive concept is not limited to this example. For example, the side surfaces of the first and second bonding pads 35 and 45 may be spaced apart from each other, when viewed in a plan view.

The cell array structure CS may be provided on the fifth insulating layer 40, and here, the cell array structure CS may include the bit lines BL and the conductive lines CL, which are connected to the connection contact plugs 41, the bit line contact plugs and the contact plugs CP, which are respectively connected to the bit lines BL and the conductive lines CL, the stack structure ST, which includes the interlayer dielectric layers ILD and the gate electrodes EL that are alternately and repeatedly stacked, the vertical channel structures VS, which are provided to penetrate the stack structure ST and are connected to the bit lines BL, and the second substrate 100, which is in contact with the vertical channel structures VS.

The cell array structure CS may further include a sixth insulating layer 50 which is provided to cover the top surface of the second substrate 100. Each of the fifth insulating layer 40 and the sixth insulating layer 50 may be formed of or include at least one of, for example, silicon oxide, silicon nitride, silicon oxynitride, and/or low-k dielectric materials.

The stack structure ST of the cell array structure CS may be provided between the second substrate 100 and the peripheral circuit structure PS. In the stack structure ST of the cell array structure CS, lengths of the gate electrodes EL in the first direction D1 may increase as a distance from the first substrate 10 (i.e., a height in the third direction D3) increases.

In a three-dimensional semiconductor memory device according some example embodiments, since germanium atoms are diffused into a channel layer, it may be possible to increase a grain size. This may make it possible to reduce a transition layer (e.g., corresponding to a boundary between grains or a grain boundary) and to increase an electron mobility and a driving current.

Alternatively or additionally, since a germanium concentration in the channel layer decreases in a direction toward a data storage pattern, it may be possible to prevent or minimize or reduce the likelihood of and/or impact from a phenomenon in which a germanium atom act as a charge trap site in a region adjacent to the data storage pattern to obstruct a carrier flow. As a result, the electron mobility and/or the driving current may be increased.

Accordingly, it may be possible to improve reliability and electrical characteristics of a three-dimensional semiconductor memory device.

While various example embodiments of inventive concepts have been particularly shown and described, it will be understood by one of ordinary skill in the art that variations in form and detail may be made therein without departing from the spirit and scope of the attached claims. Furthermore various example embodiments are not necessarily mutually exclusive. For example, some example embodiments may include features described with reference to one or more figures, and may also include other features described with reference to one or more other figures.

What is claimed is:

1. A three-dimensional semiconductor memory device, comprising:
    a substrate;
    a stack structure on the substrate and including interlayer dielectric layers alternating with and stacked with gate electrodes; and
    vertical channel structures in vertical channel holes that penetrate the stack structure,
    wherein each of the vertical channel structures comprises a data storage pattern covering an inner side surface of each of the vertical channel holes, a vertical semiconductor pattern covering the data storage pattern, and a gapfill insulating pattern filling an internal space, which is enclosed by the vertical semiconductor pattern, the vertical semiconductor pattern has a first surface in contact with the gapfill insulating pattern, and a second surface in contact with the data storage pattern, and
    a germanium concentration in the vertical semiconductor pattern continuously decreases throughout the vertical semiconductor pattern in a direction from the first surface of the vertical semiconductor pattern toward the second surface of the vertical semiconductor pattern.

2. The three-dimensional semiconductor memory device of claim 1, wherein the vertical semiconductor pattern comprises polysilicon, and
    the germanium concentration in the vertical semiconductor pattern decreases throughout the vertical semiconductor pattern with a linear or logarithmic profile in the direction from the first surface of the vertical semiconductor pattern toward the second surface of the vertical semiconductor pattern.

3. The three-dimensional semiconductor memory device of claim 1, wherein the data storage pattern comprises a blocking insulating layer, a charge storing layer, and a tunneling insulating layer, which are sequentially stacked on the inner side surface of the vertical channel holes.

4. The three-dimensional semiconductor memory device of claim 3, wherein
    the blocking insulating layer comprises silicon oxide,
    the charge storing layer comprises one or both of silicon nitride and silicon oxynitride, and
    the tunneling insulating layer comprises one or both of silicon oxide and aluminum oxide.

5. The three-dimensional semiconductor memory device of claim 1, wherein
    the data storage pattern has a second surface in contact with the vertical semiconductor pattern, and a third surface in contact with the stack structure,
    the data storage pattern comprises a diffusion region containing germanium, and
    a germanium concentration in the diffusion region decreases in a direction from the second surface of the data storage pattern toward the third surface of the data storage pattern.

6. The three-dimensional semiconductor memory device of claim 5, wherein the germanium concentration in the diffusion region is zero at a position between the second surface of the data storage pattern and the third surface of the data storage pattern.

7. The three-dimensional semiconductor memory device of claim 6, wherein the position at which the germanium concentration in the diffusion region is zero is closer to the second surface of the data storage pattern than to the third surface of the data storage pattern.

8. The three-dimensional semiconductor memory device of claim 5, wherein an absolute value of a rate of reduction of the germanium concentration in the diffusion region is greater than an absolute value of a rate of reduction of the germanium concentration in the vertical semiconductor pattern.

9. The three-dimensional semiconductor memory device of claim 1, further comprising:
    a peripheral circuit structure between the substrate and the stack structure,
    wherein the peripheral circuit structure comprises peripheral circuit transistors on the substrate.

10. The three-dimensional semiconductor memory device of claim 1, wherein each of the vertical channel structures further comprises:
    an epitaxial pattern in a lower portion of each of the vertical channel holes; and a conductive pad on the gapfill insulating pattern and the vertical semiconductor pattern and in a space delimited by the data storage pattern.

11. The three-dimensional semiconductor memory device of claim 1, wherein lengths of the gate electrodes of the stack structure increase as a distance from the substrate increases.

12. An electronic system, comprising:
a three-dimensional semiconductor memory device; and
a controller electrically connected to the three-dimensional semiconductor memory device and configured to control the three-dimensional semiconductor memory device,
wherein the three-dimensional semiconductor memory device comprises,
a first substrate,
a peripheral circuit structure on the first substrate,
a second substrate on the peripheral circuit structure
a stack structure including interlayer dielectric layers and gate electrodes, which are alternately and repeatedly stacked on the second substrate,
vertical channel structures in vertical channel holes penetrating the stack structure,
contact plugs penetrating a portion of the stack structure and connected to the gate electrodes,
bit lines on the stack structure and connected to the vertical channel structures,
conductive lines on the stack structure and connected to the contact plugs and
an input/output pad on the stack structure and connected to the peripheral circuit structure,
the controller is electrically connected to the three-dimensional semiconductor memory device through the input/output pad,
each of the vertical channel structures comprises a data storage pattern covering an inner side surface of each of the vertical channel holes, a vertical semiconductor pattern covering the data storage pattern, and a gapfill insulating pattern filling an internal space, which is in each of the vertical channel holes and is enclosed by the vertical semiconductor pattern,
the vertical semiconductor pattern has a first surface in contact with the gapfill insulating pattern and a second surface in contact with the data storage pattern, and
a germanium concentration in the vertical semiconductor pattern continuously decreases throughout the vertical semiconductor pattern in a direction from the first surface of the vertical semiconductor pattern toward the second surface of the vertical semiconductor pattern.

13. The electronic system of claim 12, wherein the data storage pattern has a second surface in contact with the vertical semiconductor pattern and a third surface in contact with the stack structure,
the data storage pattern comprises a diffusion region containing germanium, and
a germanium concentration in the diffusion region decreases in a direction from the second surface of the data storage pattern toward the third surface of the data storage pattern.

14. A three-dimensional semiconductor memory device, comprising:

a substrate;
a stack structure on the substrate and including interlayer dielectric layers alternating with and stacked with gate electrodes; and
vertical channel structures in vertical channel holes that penetrate the stack structure,
wherein each of the vertical channel structures comprises a data storage pattern covering an inner side surface of each of the vertical channel holes, a vertical semiconductor pattern covering the data storage pattern, and a gapfill insulating pattern filling an internal space, which is enclosed by the vertical semiconductor pattern,
the vertical semiconductor pattern has a first surface in contact with the gapfill insulating pattern, and a second surface in contact with the data storage pattern, and
a germanium concentration in the vertical semiconductor pattern decreases in a direction from the first surface of the vertical semiconductor pattern toward the second surface of the vertical semiconductor pattern,
wherein the data storage pattern has a second surface in contact with the vertical semiconductor pattern, and a third surface in contact with the stack structure,
the data storage pattern comprises a diffusion region containing germanium, and
a germanium concentration in the diffusion region decreases in a direction from the second surface of the data storage pattern toward the third surface of the data storage pattern.

15. The three-dimensional semiconductor memory device of claim 14, wherein the vertical semiconductor pattern comprises polysilicon.

16. The three-dimensional semiconductor memory device of claim 14, wherein the data storage pattern comprises a blocking insulating layer, a charge storing layer, and a tunneling insulating layer, which are sequentially stacked on the inner side surface of the vertical channel holes.

17. The three-dimensional semiconductor memory device of claim 16, wherein
the blocking insulating layer comprises silicon oxide,
the charge storing layer comprises one or both of silicon nitride and silicon oxynitride, and
the tunneling insulating layer comprises one or both of silicon oxide and aluminum oxide.

18. The three-dimensional semiconductor memory device of claim 14, wherein the germanium concentration in the diffusion region is zero at a position between the second surface of the data storage pattern and the third surface of the data storage pattern.

19. The three-dimensional semiconductor memory device of claim 18, wherein the position at which the germanium concentration in the diffusion region is zero is closer to the second surface of the data storage pattern than to the third surface of the data storage pattern.

20. The three-dimensional semiconductor memory device of claim 14, wherein an absolute value of a rate of reduction of the germanium concentration in the diffusion region is greater than an absolute value of a rate of reduction of the germanium concentration in the vertical semiconductor pattern.

* * * * *